United States Patent
Song et al.

(10) Patent No.: US 9,933,675 B2
(45) Date of Patent: Apr. 3, 2018

(54) METHOD OF REPAIRING DISPLAY SUBSTRATE AND DISPLAY SUBSTRATE REPAIRED BY THE METHOD

(71) Applicant: Samsung Display Co., Ltd., Yongin-si (KR)

(72) Inventors: In-Cheol Song, Daejeon (KR); Jae-Min Han, Seoul (KR); Hyung-Suk Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/153,376

(22) Filed: May 12, 2016

(65) Prior Publication Data

US 2016/0334683 A1     Nov. 17, 2016

(30) Foreign Application Priority Data

May 13, 2015 (KR) ......................... 10-2015-0066596

(51) Int. Cl.
| | |
|---|---|
| *H01L 27/12* | (2006.01) |
| *G02F 1/1362* | (2006.01) |
| *H01L 29/786* | (2006.01) |
| *G02F 1/1333* | (2006.01) |
| *G02F 1/1335* | (2006.01) |
| *G02F 1/1343* | (2006.01) |
| *G02F 1/1368* | (2006.01) |

(52) U.S. Cl.
CPC ...... *G02F 1/136259* (2013.01); *G02F 1/1368* (2013.01); *G02F 1/13439* (2013.01); *G02F 1/133345* (2013.01); *G02F 1/133514* (2013.01); *G02F 1/134309* (2013.01); *G02F 1/136227* (2013.01); *G02F 1/136286* (2013.01); *H01L 27/1244* (2013.01); *H01L 27/1248* (2013.01); *H01L 27/1259* (2013.01); *H01L 29/78633* (2013.01); *G02F 2001/136218* (2013.01); *G02F 2001/136263* (2013.01)

(58) Field of Classification Search
CPC .................... H01L 27/3248; H01L 2251/568
See application file for complete search history.

(56) References Cited

FOREIGN PATENT DOCUMENTS

| KR | 10-2009-0114214 | 11/2009 |
|---|---|---|
| KR | 10-2011-0101000 | 9/2011 |
| KR | 10-2012-0055075 | 5/2012 |
| KR | 10-2012-0126783 | 11/2012 |
| KR | 10-2013-0143420 | 12/2013 |

*Primary Examiner* — Julia Slutsker
(74) *Attorney, Agent, or Firm* — H.C. Park & Associates, PLC

(57) ABSTRACT

A display substrate includes a gate metal pattern including a gate line extending in a first direction, a gate electrode electrically connected to the gate line and a storage line, a data metal pattern including a data line extending in a second direction crossing the first direction, a source electrode electrically connected to the data line and a drain electrode spaced apart from the source electrode, an organic layer disposed on the data metal pattern, and a repair hole formed through the organic layer and exposing a portion of the gate metal pattern or a portion of the data metal pattern.

9 Claims, 34 Drawing Sheets

METHOD OF REPAIRING DISPLAY SUBSTRATE AND DISPLAY SUBSTRATE REPAIRED BY THE METHOD

CROSS-REFERENCE TO RELATED APPLICATION

This application claims priority from and the benefit of Korean Patent Application No. 10-2015-0066596, filed on May 13, 2015, which is hereby incorporated by reference for all purposes as if fully set forth herein.

BACKGROUND

Field

Exemplary embodiments relate to a method of repairing a display substrate and a display substrate repaired by the method. More particularly, exemplary embodiments relate to a method of repairing a display substrate using an ultra-fast laser and a display substrate repaired by the method.

Discussion of the Background

A liquid crystal display (LCD) panel may generally include a thin-film transistor (TFT) substrate, an opposing substrate, and a liquid crystal (LC) layer. The TFT substrate includes gate lines, data lines crossing the gate lines, TFTs connected with the gate lines and the data lines, and pixel electrodes connected with the TFTs. The TFT may include a gate electrode extended from the gate line, a source electrode extended to the data line, and a drain electrode spaced apart from the source electrode.

The signal line of the array substrate may have an electrical connection failure such as a short circuit, a shorting failure, etc., which may deteriorate a display quality of the LCD panel. Therefore, it may be necessary to repair the signal line having the electrical connection failure.

A conventional method of repairing the signal line may include forming a repairing line on the protecting layer. The repairing line may be electrically connected to the signal line to repair the electrical connection failure. However, when a color filter is disposed on the same lower substrate as the gate line and the data line, the color filter may cover the data line, which may render repairing the signal line difficult. In addition, when the repair line is not in contact with the data line, repairing the defects may be almost impossible.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide method of repairing a display substrate including an organic layer.

Additional aspects will be set forth in the detailed description which follows, and, in part, will be apparent from the disclosure, or may be learned by practice of the inventive concept.

An exemplary embodiment discloses a display substrate including a gate metal pattern including a gate line extending in a first direction, a gate electrode electrically connected to the gate line and a storage line, a data metal pattern including a data line extending in a second direction crossing the first direction, a source electrode electrically connected to the data line and a drain electrode spaced apart from the source electrode, an organic layer disposed on the data metal pattern, and a repair hole formed through the organic layer and exposing a portion of the gate metal pattern or a portion of the data metal pattern.

An exemplary embodiment also discloses a method of repairing a display substrate having defects from disconnection of a data line therein including irradiating an ultra-fast laser to an organic layer disposed on the data line, removing portions of the organic layer disposed over first and second areas of the data line, the first and second areas of the data line being spaced apart from a disconnection point of the data line, to expose the data line in the first and second areas such that repair holes spatially connecting the first and second areas are formed, ablating side portions of the exposed data line in the first and second areas, forming a repair line in the repair holes, in which the display substrate includes a gate metal pattern including a gate line extending in a first direction, and a gate electrode electrically connected to the gate line and a storage line, a data metal pattern including the data line extending in a second direction crossing the first direction, a source electrode electrically connected to the data line, and a drain electrode spaced apart from the source electrode, the organic layer disposed on the data metal pattern.

An exemplary embodiment further discloses a method of repairing a display substrate having defects from shorting of a gate metal pattern or shorting of a data metal pattern therein including irradiating an ultra-fast laser to an organic layer disposed on the data metal pattern, removing a portion of the organic layer disposed over a shorting point of the gate metal pattern or the data metal pattern, such that the shorting point is exposed, and cutting the shorting point of the gate metal pattern or the data metal pattern, in which the display substrate includes the gate metal pattern including a gate line extending in a first direction, a gate electrode electrically connected to the gate line and a storage line, the data metal pattern including a data line extending in a second direction crossing the first direction, a source electrode electrically connected to the data line, and a drain electrode spaced apart from the source electrode, and the organic layer disposed on the data metal pattern.

According to an exemplary embodiment, a method of repairing a display substrate uses an ultra-fast laser to selectively remove an organic layer overlapping the gate metal pattern or the data metal pattern having defects, such that defects of display substrate may be repaired exquisitely.

According to an exemplary embodiment, a method of repairing a display substrate also includes forming a light-blocking portion in a peripheral area of the repair hole, which may block light leakage through the repair hole.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
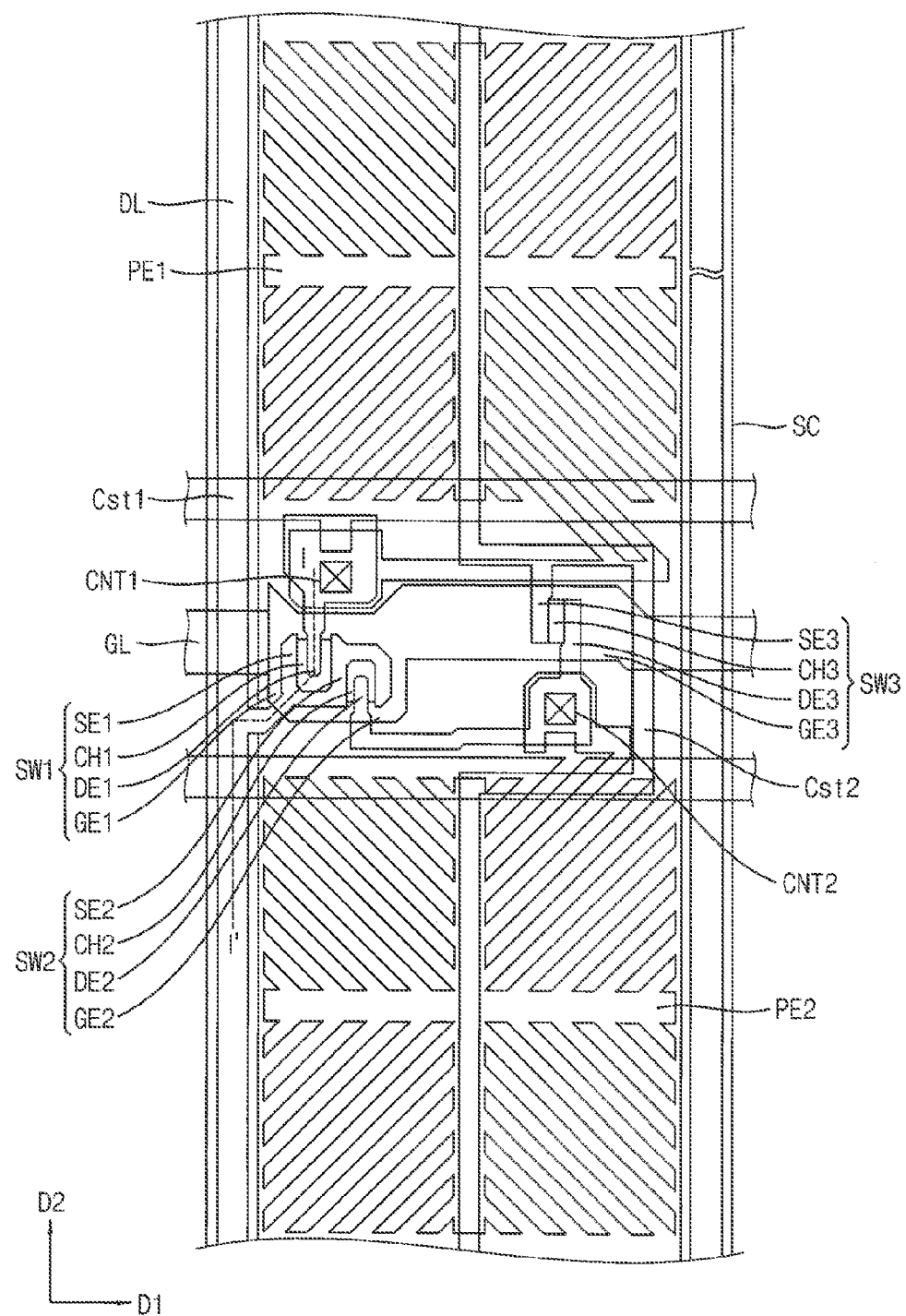
FIG. 1 is a plan view illustrating a display substrate according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
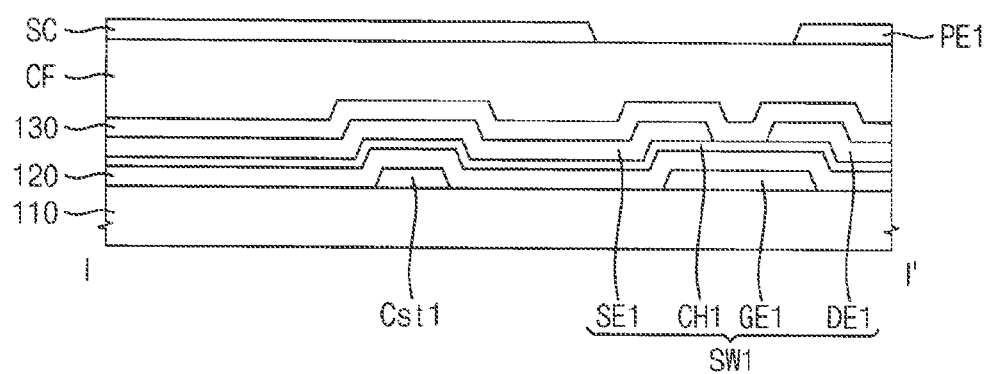
FIG. 2 is a cross-sectional view taken along line I-I' of FIG. 1.

FIG. 1 is a plan view illustrating a display substrate according to an exemplary embodiment. FIG. 2 is a cross-sectional view taken along line I-I' of FIG. 1.

Referring to FIGS. 1 and 2, a display substrate includes a gate line GL, a data line DL, a first storage line Cst1, a second storage line Cst2, a shielding electrode SC, a first switching element SW1, a second switching element SW2, a third switching element SW3, a high-pixel electrode PE1, and a low-pixel electrode PE2.

The gate line GL extends in a first direction D1. The gate line GL may have a single layer structure including copper (Cu), silver (Ag), chrome (Cr), molybdenum (Mo), aluminum (Al), titanium (Ti), manganese (Mn), and a mixture thereof. Alternatively, the gate line GL may have a multi-layer structure having multiple layers including materials different from each other. For example, the gate line GL may include a copper layer and a titanium layer disposed on and/or under the copper layer. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first storage line Cst1 extends in the first direction D1. The first storage line Cst1 overlaps with the high-pixel electrode PE1. The first storage line Cst1 is formed from the same layer as the gate line GL. Thus, the first storage line Cst1 may be disposed on the same layer as the gate line GL. The first storage line Cst1 may have a single layer structure including copper (Cu), silver (Ag), chrome (Cr), molybdenum (Mo), aluminum (Al), titanium (Ti), manganese (Mn), and a mixture thereof. Alternatively, the first storage line Cst1 may have a multi layer structure having multiple layers including materials different each other. For example, the first storage line Cst1 may include a copper layer and a titanium layer disposed on and/or under the copper layer.

A first insulation layer 120 is formed on the gate line GL and the first storage line Cst1. The first insulation layer 120 may include an inorganic material such as silicon oxide (SiOx) and/or silicon nitride (SiNx). For example, the first insulation layer 120 includes silicon oxide (SiOx), and may have a thickness of about 500 Å. In addition, the first insulation layer 120 may include multiple layers including different materials from each other.

The data line DL is formed on first insulation layer 120. The data line DL extends in a second direction D2 crossing the first direction D1. The data line DL crosses the gate line GL. The data line DL may have a single layer structure including copper (Cu), silver (Ag), chrome (Cr), molybdenum (Mo), aluminum (Al), titanium (Ti), manganese (Mn), and a mixture thereof. Alternatively, the data line DL may have a multi layer structure having multiple layers including materials different each other. For example, the data line DL may include a copper layer and a titanium layer disposed on and/or under the copper layer. The data line DL may be electrically connected to a first source electrode SE1 of the first switching element SW1 and a second source electrode SE2 of the second switching element SW2.

The second storage line Cst2 is formed from the same layer as the data line DL. Thus, the second storage line Cst2 may be disposed on the same layer as the data line DL. The second storage line Cst2 may have a single layer structure including copper (Cu), silver (Ag), chrome (Cr), molybdenum (Mo), aluminum (Al), titanium (Ti), manganese (Mn), and a mixture thereof. Alternatively, the second storage line Cst2 may have a multi layer structure having multiple layers including materials different each other. For example, the second storage line Cst2 may include a copper layer and a titanium layer disposed on and/or under the copper layer. The second storage line Cst2 may be electrically connected to a third source electrode SE3 of the third switching element SW3.

A second insulation layer 130 is formed on the data line DL and the second storage line Cst2. The second insulation layer 130 may include an inorganic material such as silicon oxide (SiOx) and/or silicon nitride (SiNx). For example, the second insulation layer 130 includes silicon oxide (SiOx), and may have a thickness of about 500 Å. In addition, the second insulation layer 130 may include multiple layers including different materials from each other.

An organic layer CF is disposed on the second insulation layer 130. The organic layer CF may planarize an upper surface of the substrate, so as to prevent disconnection of a signal line. The organic layer CF may be an insulation layer including an organic material. For example, the organic layer CF may a color filter layer.

A shielding electrode SC is disposed on the organic layer CF. The shielding electrode SC may include a transparent conductive material, such as indium tin oxide (no) and indium zinc oxide (IZO). In addition, the shielding electrode SC may include titanium (Ti) and/or molybdenum titanium (MoTi).

A display panel according to an exemplary embodiment may include a display substrate, a facing substrate facing the display substrate, and liquid crystal layer interposed between the display substrate and the facing substrate. The facing substrate may include a common electrode. The common electrode is formed on an entire region of the facing substrate and may include a transparent conductive material. A common voltage is applied to the common electrode. The common voltage may be applied to the shielding electrode SC. When the common voltage is applied to the shielding electrode SC, liquid crystal molecules disposed on the shielding electrode SC may be aligned in a vertical direction. Thus, a direction of the liquid crystal molecules may be equal to a direction of a polarizer, so that a region of the shielding electrode SC may be black. Accordingly, light may be blocked without a black matrix.

The high-pixel electrode PE1 and the low-pixel electrode PE2 may be formed from the same layer as the shielding electrode SC. The high-pixel electrode PE1 and the low-pixel electrode PE2 may include a transparent conductive material, such as indium tin oxide (ITO) and indium zinc oxide (IZO). In addition, the high-pixel electrode PE1 and the low-pixel electrode PE2 may include titanium (Ti) and/or molybdenum titanium (MoTi).

The high-pixel electrode PE1 is disposed adjacent to the gate line GL in the second direction D2, and between the data lines DL. The high-pixel electrode PE1 is electrically connected to a first drain electrode DE1 of the first switching element SW1 through a first contact hole CNT1.

The low-pixel electrode PE2 is disposed opposite to the high-pixel electrode PE1 with reference to the gate line GL, and between the data lines DL. The low-pixel electrode PE2 is electrically connected to the second drain electrode DE2 of the second switching element SW2 and the third drain electrode DE3 of the third switching element SW3 through a second contact hole CNT2.

A first voltage may be applied to the high-pixel electrode PE1. A second voltage different from the first voltage may be applied to the low-pixel electrode PE2. For example, the first voltage may be higher than the second voltage. A portion of the pixel corresponding to the high-pixel electrode PE1 may be driven as a high pixel, and another portion of the pixel corresponding to the low-pixel electrode PE2 may be driven as a low pixel.

The first switching element SW1 includes the first gate electrode GE1, the first source electrode SE1, the first drain electrode DE1, and a first channel portion CH1 connecting the first source electrode SE1 to the first drain electrode DE1.

The first channel portion CH1 may include a semiconductor layer including amorphous silicon (a-Si:H) and an ohmic contact layer including n+ amorphous silicon (n+ a-Si:H). The first channel portion CH1 may include an oxide semiconductor. The oxide semiconductor may include an amorphous oxide including at least one of indium (In), zinc (Zn), gallium (Ga), tin (Sn), and hafnium (Hf).

The second switching element SW2 includes the second gate electrode GE2, the second source electrode SE2, the second drain electrode DE2, and a second channel portion CH2 connecting the second source electrode SE2 to the second drain electrode DE2.

The second channel portion CH2 may include a semiconductor layer including amorphous silicon (a-Si:H) and an ohmic contact layer including n+ amorphous silicon (n+ a-Si:H). The second channel portion CH2 may include an oxide semiconductor. The oxide semiconductor may include an amorphous oxide including at least one of indium (In), zinc (Zn), gallium (Ga), tin (Sn), and hafnium (Hf).

The third switching element SW3 includes the third gate electrode GE3, the third source electrode SE3, the third drain electrode DE3, and a third channel portion CH3 connecting the third source electrode SE3 to the third drain electrode DE3.

The third channel portion CH3 may include a semiconductor layer including amorphous silicon (a-Si:H) and an ohmic contact layer including n+ amorphous silicon (n+ a-Si:H). The third channel portion CH3 may include an oxide semiconductor. The oxide semiconductor may include an amorphous oxide including at least one of indium (In), zinc (Zn), gallium (Ga), tin (Sn), and hafnium (Hf).

FIGS. 3 to 6 are cross-sectional views illustrating a method of manufacturing the display substrate of FIG. 2.

Figure 3:
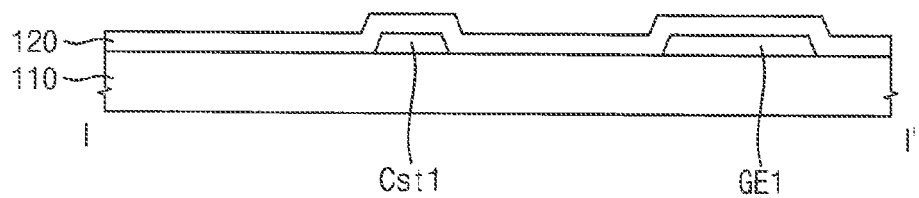
FIG. 3, FIG. 4, FIG. 5, and FIG. 6 are cross-sectional views illustrating a method of manufacturing the display substrate of FIG. 2.

Referring to FIG. 3, a gate metal layer is formed on a base substrate 110. The gate metal layer may be partially etched by a photolithography process or an etching process using an additional etching mask, to form the gate pattern. The gate pattern includes a first storage line Cst1, a gate line GL, a first gate electrode GE1, a second gate electrode GE2, and a third gate electrode GE3.

The base substrate 110 may include a material having relatively high transmittance, thermal resistance, and chemical resistance. For example, the base substrate 110 may include any one of glass, polyethylenenaphthalate, polyethylene terephthalate, polyacryl, and a mixture thereof.

The gate pattern may include a metal, a metal alloy, a metal nitride, a conductive metal oxide, a transparent conductive material, and etc. For example, the gate pattern may include copper (Cu), which is opaque.

The first insulation layer 120 is disposed on the gate pattern. The first insulation layer 120 is disposed on the gate pattern. The first insulation layer 120 covers and insulates the first storage line Cst1, the gate line GL, the first gate electrode GE1, the second gate electrode GE2, and the third gate electrode GE3.

Figure 4:
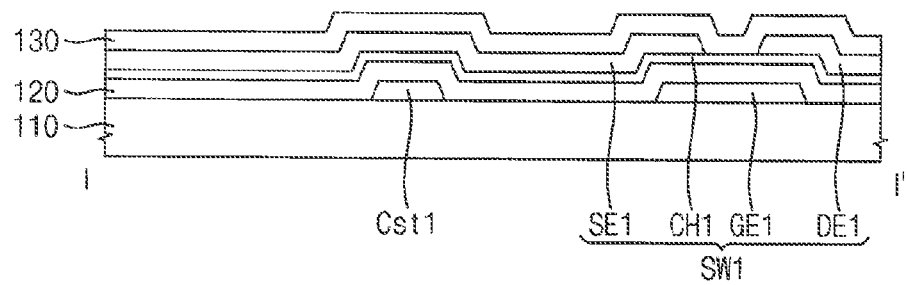

Referring to FIG. 4, a semiconductor layer and a data metal layer are disposed on the first insulation layer 120. Thereafter, the semiconductor layer and the data metal layer may be partially etched by a photolithography process or an etching process using an additional etching mask, to form a channel layer including a first channel portion CH1 and a data metal pattern.

The channel layer may include a silicon semiconductor layer including amorphous silicon (a-Si:H) and an ohmic contact layer including n+ amorphous silicon (n+ a-Si:H). The channel layer may include an oxide semiconductor. The oxide semiconductor may include an amorphous oxide including at least one of indium (In), zinc (Zn), gallium (Ga), tin (Sn), and hafnium (Hf).

The data metal pattern have a single layer structure including copper (Cu), silver (Ag), chrome (Cr), molybdenum (Mo), aluminum (Al), titanium (Ti), manganese (Mn), and a mixture thereof. Alternatively, the data metal pattern may have a multi layer structure having multiple layers including materials different each other.

A second insulation layer 130 is disposed on the data metal pattern and the channel layer. The second insulation layer 130 may be formed by a spin coating process, a printing process, a sputtering process, a chemical vapor deposition (CVD) process, an atomic layer deposition (ALD) process, a plasma-enhanced chemical vapor deposition (PECVD) process, a high-density plasma chemical vapor deposition (HDP-CVD) process, or a vacuum evaporation process, in accordance with ingredients included in the second insulation layer 130. The second insulation layer 130 is disposed on the data pattern. The second insulation layer 130 covers and insulates the first drain electrode DE1, the first source electrode SE1, the second source electrode SE2, the second drain electrode DE2, the third source electrode SE3, the third drain electrode DE3, and the data line DL.

Figure 5:
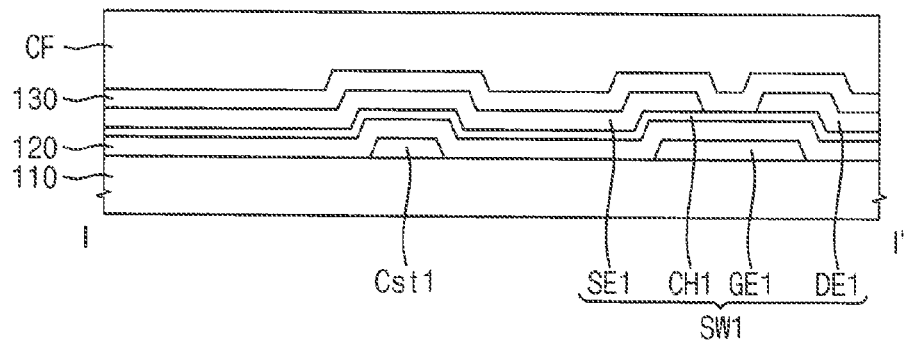

Referring to FIG. 5, an organic layer CF is disposed on the second insulation layer 130. The organic layer CF may be a color filter layer. A photoresist is formed on the second insulation layer 130, and then the photoresist is exposed using a mask, and then the photoresist is developed using a developing solution, to form the organic layer CF.

The organic layer CF is disposed on the second insulation layer 130. When the organic layer CF is the color filter layer, the color filter layer may supply colors to light passing through the liquid crystal layer. The color filter layer may include a red color filter layer, a green color filter layer, and blue color filter layer. The color filter layer corresponds to a unit pixel. The color filter layers adjacent to each other may have different colors. The color filter layer may be overlapped with adjacent color filter layer in a boundary of the adjacent unit pixels. In addition, the color filter layer may be spaced apart from adjacent color filter layer in the boundary of the adjacent unit pixels.

Figure 6:
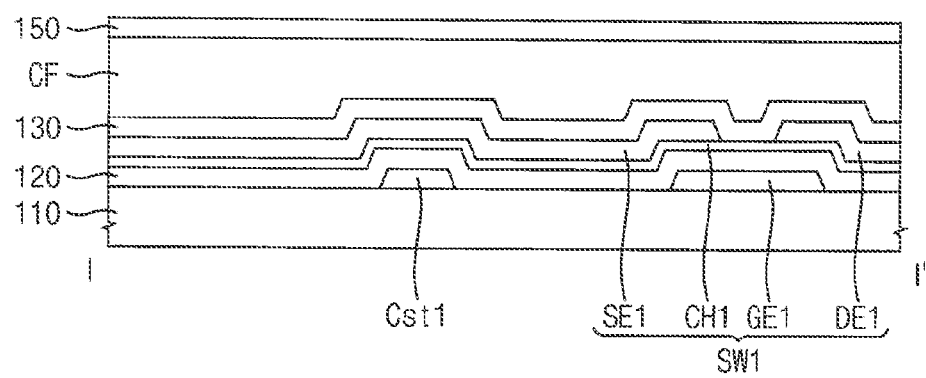

Referring to FIG. 6, a transparent conductive layer 150 is disposed on the organic layer CF. The transparent conductive layer 150 may include a transparent conductive material, such as indium tin oxide (ITO) and indium zinc oxide (IZO). In addition, the transparent conductive layer 150 may include titanium (Ti) and/or molybdenum titanium (MoTi).

Referring back to FIG. 2, the transparent conductive layer 150 is patterned to form the shielding electrode SC and the pixel electrode. The pixel electrode may include the high-pixel electrode PE1 and the low-pixel electrode PE2.

The shielding electrode SC may include a transparent conductive material, such as indium tin oxide (ITO) and indium zinc oxide (IZO). In addition, the shielding electrode SC may include titanium (Ti) and/or molybdenum titanium (MoTi).

The high-pixel electrode PE1 and the low-pixel electrode PE2 may be formed from the same layer as the shielding electrode SC. The high-pixel electrode PE1 and the low-pixel electrode PE2 may include a transparent conductive material, such as indium tin oxide (ITO) and indium zinc oxide (IZO). In addition, the high-pixel electrode PE1 and the low-pixel electrode PE2 may include titanium (Ti) and/or molybdenum titanium (MoTi).

Figure 7:
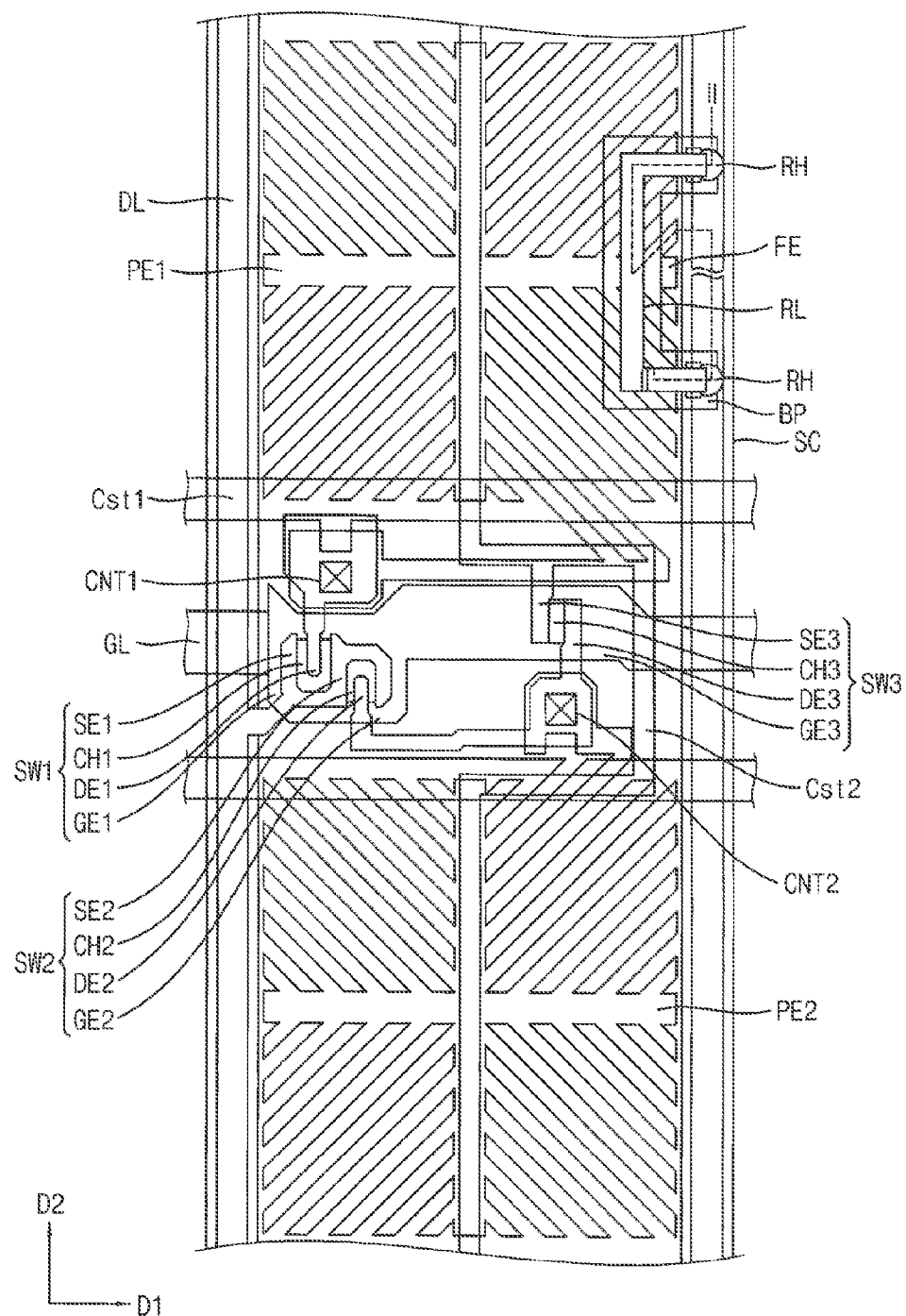
FIG. 7 is a plan view illustrating a display substrate repaired by a method of repairing a display substrate according to an exemplary embodiment.
Figure 8:
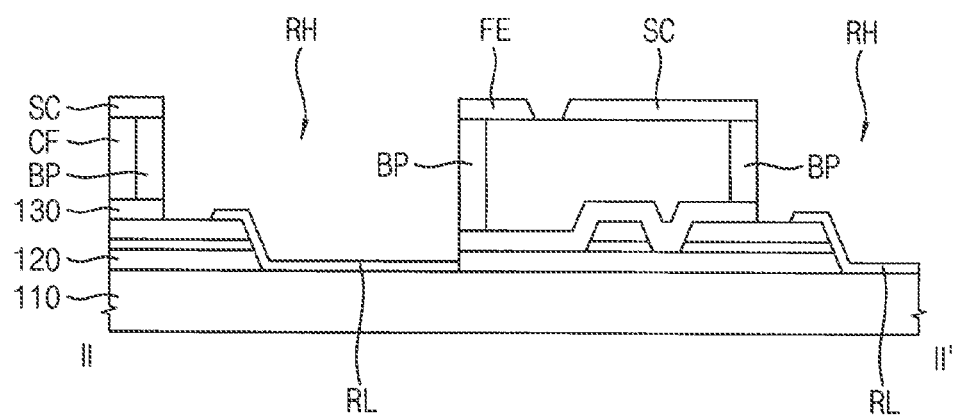
FIG. 8 is a cross-sectional view taken along line II-II' of FIG. 7.

FIG. 7 is a plan view illustrating a display substrate repaired by a method of repairing a display substrate according to an exemplary embodiment. FIG. 8 is a cross-sectional view taken along line II-II' of FIG. 7.

FIGS. 7 and 8 illustrate a repaired display substrate, of which a defect therein may have been caused by disconnection of the data line.

A display substrate repaired by a method according to an exemplary embodiment includes a gate line GL, a data line DL, a first storage line Cst1, a second storage line Cst2, a shielding electrode SC, a first switching element SW1, a second switching element SW2, a third switching element SW3, a high-pixel electrode PE1, a low-pixel electrode PE2, a repair hole RH, a light-blocking portion BP, a repair line RL, and a floating electrode FE.

A display substrate according to an exemplary embodiment includes a data line having a defect caused by disconnection of the data line DL.

The repair hole RH is formed through the organic layer CF. The repair hole RH is formed by removing a portion of the organic layer CF. The repair hole RH may be formed by using a laser, more particularly, an ultra-fast laser. For example, the ultra-fast laser may be a pico-second laser, a femto-second laser, or an atto-second laser.

When an organic layer CF is disposed on the same substrate as the gate metal pattern and the data metal pattern, the organic layer CF may cover the gate metal pattern and the data metal pattern, which may increase the possibility of repair failure. Accordingly, the gate metal pattern or the data metal pattern having defects may be repaired, after removing the organic layer CF by using laser. However, when the organic layer CF is removed by using a nano-second laser, selective removing of the organic layer CF may be difficult, which may render exquisite repairing of the gate metal pattern or the data metal pattern having defects difficult.

According to an exemplary embodiment, a method of repairing a display substrate uses an ultra-fast laser for removing the organic layer CF, which may selectively remove the organic layer CF. Accordingly, since selective removing of the organic layer CF overlapping the gate metal pattern or the data metal pattern having defects may be possible, defects of the display substrate may be repaired exquisitely.

The repair hole RH may expose the gate metal pattern or the data metal pattern having defects. In the present exemplary embodiment, a data line DL having defects caused by disconnection may be partially exposed.

A process of forming the repair hole RH may include irradiating an ultra-fast laser to the organic layer CF, to remove a portion of the organic layer CF disposed over two areas of the data line DL spaced apart from a disconnection point of the data line DL, such that the data line DL between the two areas is exposed.

Thereafter, side portions of the two areas of the exposed data line DL are ablated, such that a slope thereof may be smoothened. When slope of the side portions of the two areas of the exposed data line DL is steep, forming the repair line RL may be difficult. Accordingly, a laser is irradiated onto the side portions of the two areas of the exposed data line DL, such that the slope thereof may be smoothened.

The process of ablating side portions of the two areas of the exposed data line DL may be performed by using an ultra-fast laser. For example, the ultra-fast laser may be a pico-second laser, a femto-second laser, or an atto-second laser.

Thereafter, a portion of the organic layer CF is removed, to form a repair hole RH spatially connecting the two areas of the exposed data line DL. The process of forming a repair hole RH may be performed by using the ultra-fast laser. For example, the ultra-fast laser may be a pico-second laser, a femto-second laser, or an atto-second laser.

In the process of forming the repair hole RH, a high pixel electrode PE1 disposed on the organic layer CF may be partially removed. That is, the high pixel electrode PE1 overlapping the repair hole RH may be removed. Accordingly, a floating electrode FE disposed adjacent to the repair hole RH may be formed. The floating electrode FE is disposed on the same layer as the high pixel electrode PE1. The floating electrode FE is insulated from the high pixel electrode PE1.

The repair line RL is then formed in the repair hole RH. The repair line RL is electrically connected to the exposed data line DL. More particularly, both ends of the repair line RL are electrically connected to the two areas of the exposed data line DL, respectively. Thus, a disconnected data line DL may be electrically connected through the repair line RL. The repair line RL is disposed on the same layer as the data line DL.

The repair line RL may be formed by a laser chemical vapor deposition (CVD) method. The laser CVD method may partially irradiate a laser beam onto an object, to deposit a vaporized material where the laser beam is irradiated. More particularly, a laser beam is irradiated along the repair hole RH to deposit the repair line RL in the repair hole RH. A material that may be used for the repair line RL may be substantially the same as the material used for the data line DL. The repair line RL is electrically connected to the data line DL on the two areas of the exposed data line DL. Alternatively, the repair line RL may be formed by an inkjet method.

After the repair line RL is formed, a light-blocking portion BP is formed in a peripheral area of the repair hole RH. A laser is irradiated onto the organic layer CF adjacent to the repair hole RH to form the light-blocking portion BP. The light-blocking portion BP is formed by using the ultra-fast laser. For example, the ultra-fast laser may be a pico-second laser, a femto-second laser, or an atto-second laser.

When the organic layer CF is carbonized by a laser, the light-blocking portion BP may be formed. The laser may be irradiated onto the organic layer CF continuously or discontinuously. A degree of carbonization of the organic layer CF may vary depending on quantity, repetition rate, wave length, or pulse width of a laser. The light-blocking portion BP may have a black color, and thus may block light. The light-blocking portion BP is disposed on the same layer as the organic layer CF.

When the organic layer CF is selectively removed, the repair hole RH may be formed, which may cause light leakage through the selectively removed portion. However, a method of repairing a display substrate according to an exemplary embodiment includes forming the light-blocking portion BP. Thus, light leaked through the repair hole RH may be blocked. Forming the light-blocking portion BP may be omitted, when light leaked through the repair hole RH may be insignificant.

Figure 9:
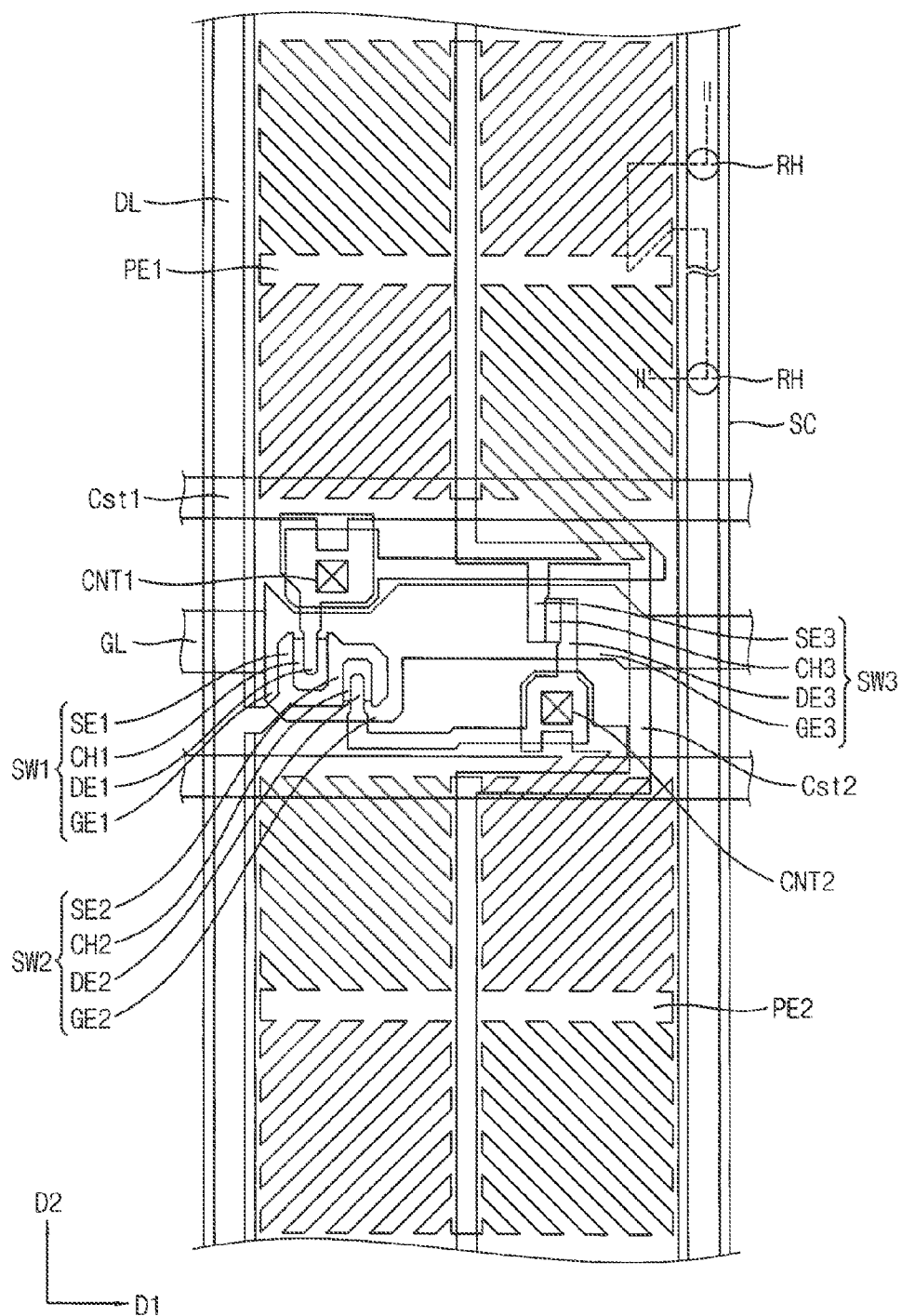
FIG. 9 is a plan view illustrating a display substrate repaired by a method of repairing a display substrate of FIG. 7.
Figure 10:
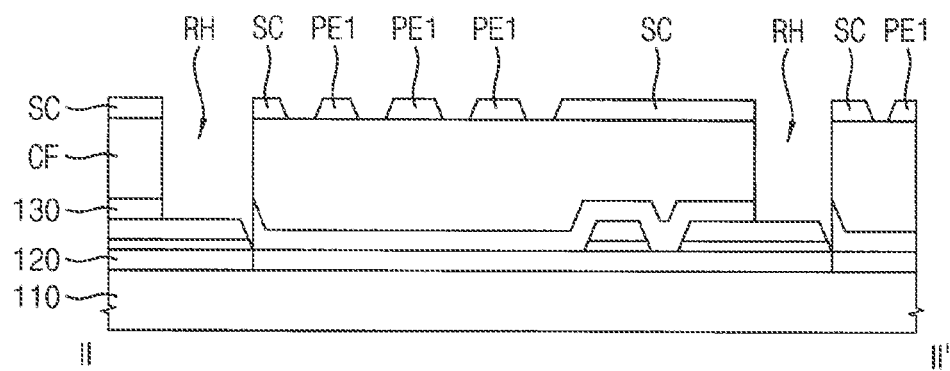
FIG. 10 is a cross-sectional view taken along line II-II' of FIG. 9.

FIG. 9 is a plan view illustrating a display substrate repaired by a method of repairing a display substrate of FIG. 7. FIG. 10 is a cross-sectional view taken along line II-II' of FIG. 9.

Referring to FIGS. 9 and 10, a portion of the organic layer CF disposed on two is areas of the data line DL spaced apart from a disconnection point of the data line DL is partially removed, to expose the two areas of the data line DL.

The repair hole RH is formed by removing a portion of the organic layer CF. The repair hole RH is formed by using a laser. The repair hole RH is formed by using an ultra-fast laser. For example, the ultra-fast laser may be a pico-second laser, a femto-second laser, or an atto-second laser.

The repair hole RH may expose the gate metal pattern or the data metal pattern having defects. In the present exemplary embodiment, a data line DL having defects caused by disconnection may be partially exposed. A process of forming the repair hole RH may include irradiating an ultra-fast laser to the organic layer CF, to remove a portion of the organic layer CF disposed over two areas of the data line DL spaced apart from a disconnection point of the data line DL, and expose the two areas of the data line DL.

Figure 11:
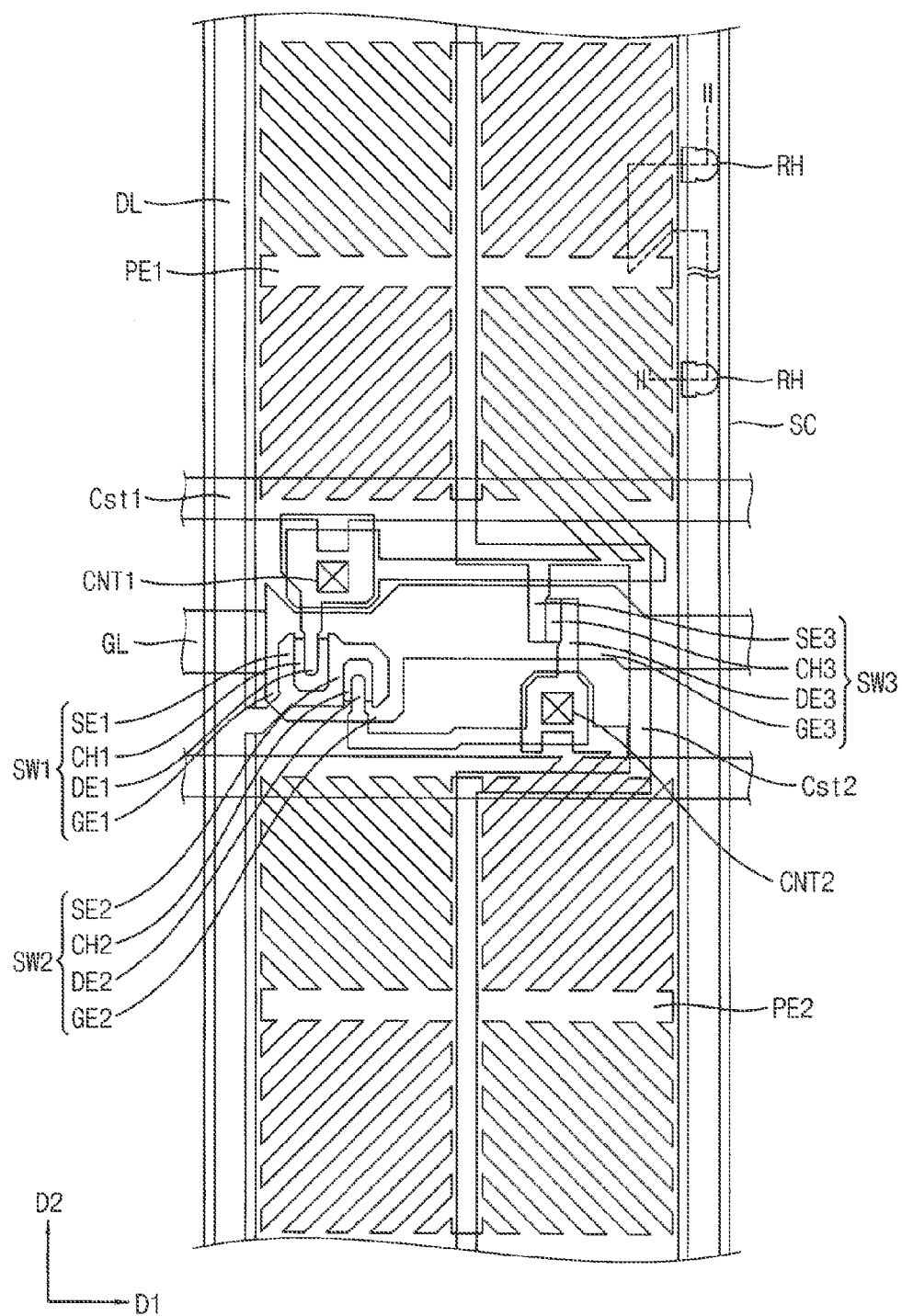
FIG. 11 is a plan view illustrating a display substrate repaired by a method of repairing a display substrate of FIG. 7.
Figure 12:
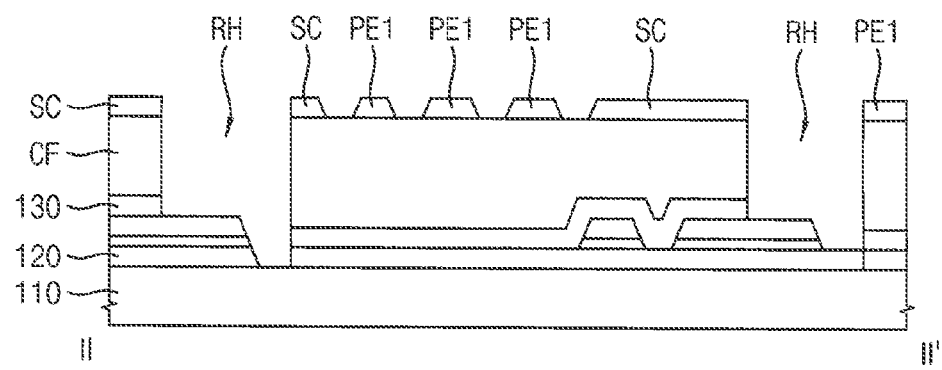
FIG. 12 is a cross-sectional view taken along line II-II' of FIG. 11.

FIG. 11 is a plan view illustrating a display substrate repaired by a method of repairing a display substrate of FIG. 7. FIG. 12 is a cross-sectional view taken along line II-II' of FIG. 11.

Referring to FIGS. 11 and 12, side portions of the two areas of the exposed data line DL are ablated. When slope of the side portions of the two areas of the exposed data line DL is steep, forming the repair line RL may be difficult. Thus, a laser is irradiated onto the side portions of the two areas of the exposed data line DL, so as to smoothen the slope of the side portions of the two areas of the exposed data line DL. The process of ablating side portions of the two areas of the exposed data line DL may be performed by using an ultra-fast laser. For example, the ultra-fast laser may be a pico-second laser, a femto-second laser, or an atto-second laser.

Figure 13:
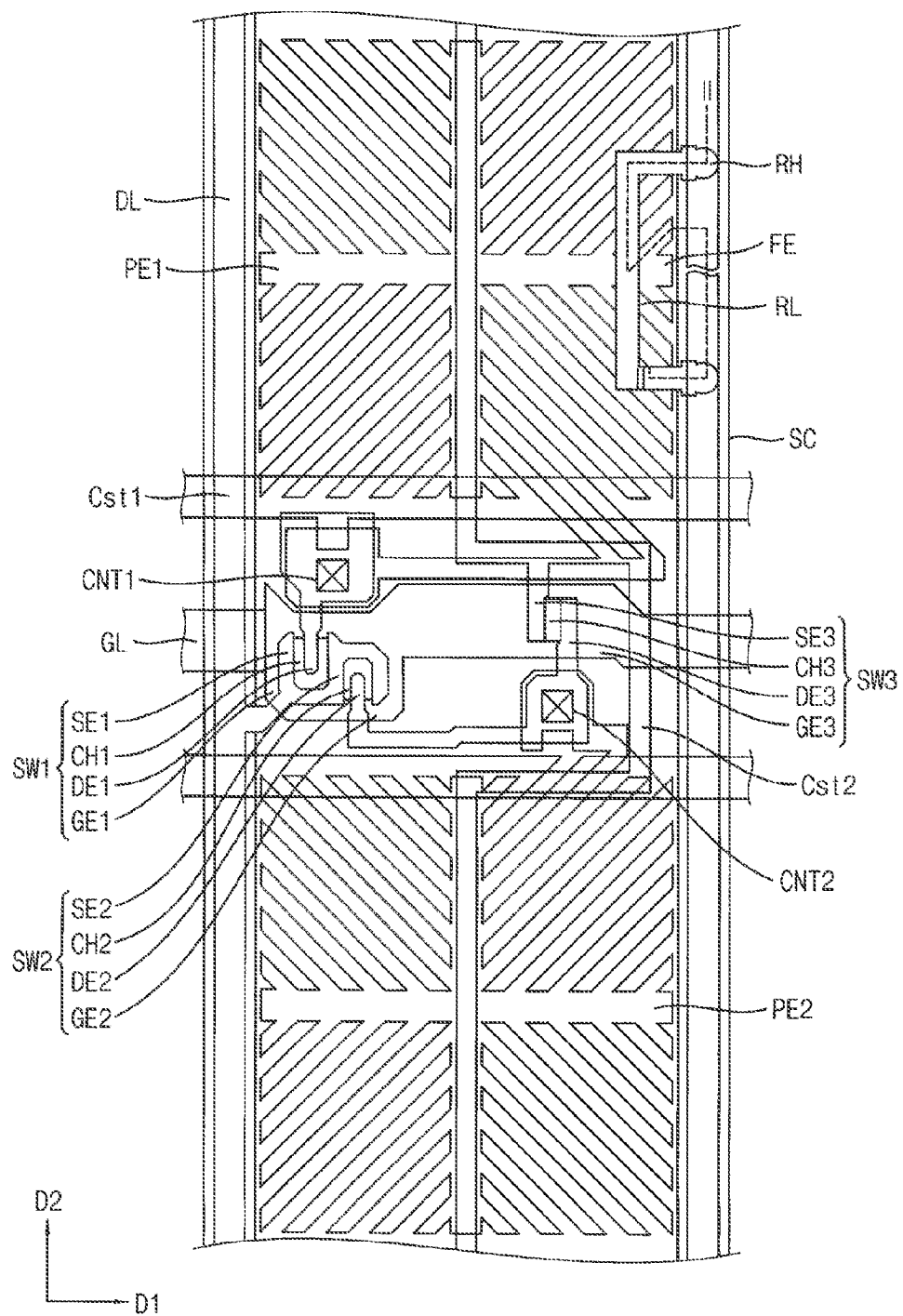
FIG. 13 is a plan view illustrating a display substrate repaired by a method of repairing a display substrate of FIG. 7.
Figure 14:
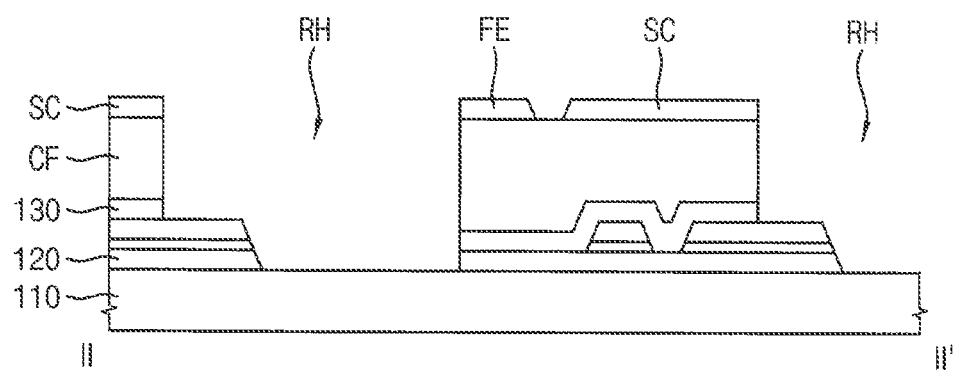
FIG. 14 is a cross-sectional view taken along line II-II' of FIG. 13.

FIG. 13 is a plan view illustrating a display substrate repaired by a method of repairing a display substrate of FIG. 7. FIG. 14 is a cross-sectional view taken along line II-II' of FIG. 13.

Referring to FIGS. 13 and 14, a portion of the organic layer CF is removed to form a repair hole RH spatially connecting the two areas of the exposed data line DL. The process of forming a repair hole RH may be performed by using the ultra-fast laser. For example, the ultra-fast laser may be a pico-second laser, a femto-second laser, or an atto-second laser.

In the process of forming the repair hole RH, a high pixel electrode PE1 disposed on the organic layer CF is partially removed. That is, the high pixel electrode PE1 overlapping the repair hole RH is removed. Thus, a floating electrode FE disposed adjacent to the repair hole RH may be formed. The floating electrode FE is disposed on the same layer as the high pixel electrode PE1. The floating electrode FE is insulated from the high pixel electrode PE1.

Figure 15:
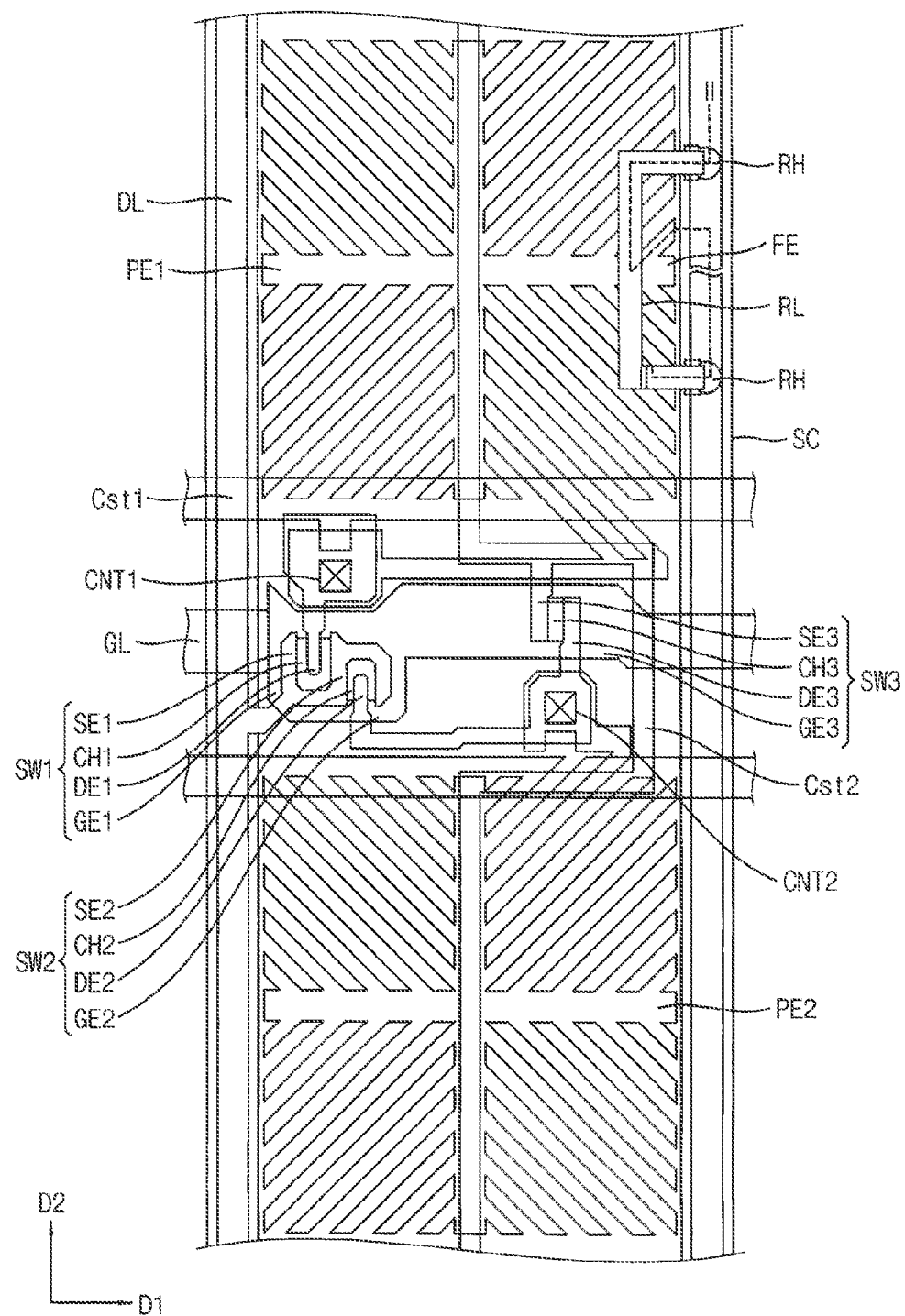
FIG. 15 is a plan view illustrating a display substrate repaired by a method of repairing a display substrate of FIG. 7.
Figure 16:
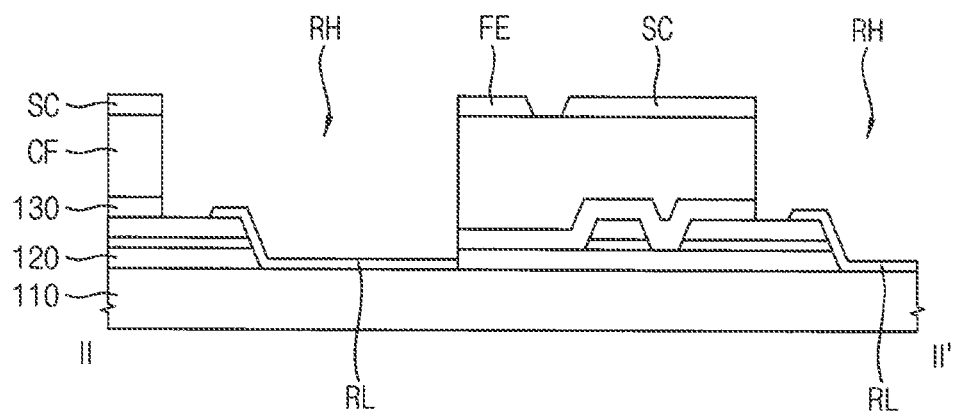
FIG. 16 is a cross-sectional view taken along line II-II' of FIG. 15.

FIG. 15 is a plan view illustrating a display substrate repaired by a method of repairing a display substrate of FIG. 7. FIG. 16 is a cross-sectional view taken along line II-II' of FIG. 15.

Referring to FIGS. 15 and 16, a repair line RL is formed in the repair hole RH. The repair line RL is electrically connected to the exposed data line DL. That is, both ends of the repair line RL are electrically connected to the two areas of the exposed data line DL, respectively. Thus, a disconnected data line DL may be electrically connected through the repair line RL. The repair line RL is disposed on the same layer as the data line DL.

The repair line RL may be formed by a laser chemical vapor deposition (CVD) method. The laser CVD method partially irradiates a laser beam onto an abject, to deposit a vaporized material where the laser beam is irradiated. As such, a laser beam is irradiated along the repair hole RH, to deposit the repair line RL in the repair hole RH. A material that may be used for the repair line RL may be substantially the same as the material used for the data line DL. The repair line RL is electrically connected to the data line DL on the two areas of the exposed data line DL. Alternatively, the repair line RL may be formed by an inkjet method.

Referring back to FIGS. 7 and 8, a light-blocking portion BP is formed in a peripheral area of the repair hole RH.

After the repair line RL is formed, a light-blocking portion BP is formed in a peripheral area of the repair hole RH. A laser is irradiated onto the organic layer CF adjacent to the repair hole RH to form the light-blocking portion BP. The light-blocking portion BP is formed by using an ultra-fast laser. For example, the ultra-fast laser may be a pico-second laser, a femto-second laser, or an atto-second laser.

When the organic layer CF is carbonized by a laser, the light-blocking portion BP may be formed. The laser may be irradiated onto the organic layer CF continuously or discontinuously. A degree of carbonization of the organic layer CF may vary depending on quantity, repetition rate, wave length, or pulse width of a laser. The light-blocking portion BP may have a black color. Thus, the light-blocking portion BP may block light. The light-blocking portion BP is disposed on the same layer as the organic layer CF.

The organic layer CF is selectively removed, the repair hole RH may be formed, which may cause light leakage through a selectively removed portion. According to an exemplary embodiment, a method of repairing a display substrate includes forming the light-blocking portion BP, to block light leaked through the repair hole RH. Forming the light-blocking BP may be omitted, when light leaked through the repair hole RH is insignificant.

Figure 17:
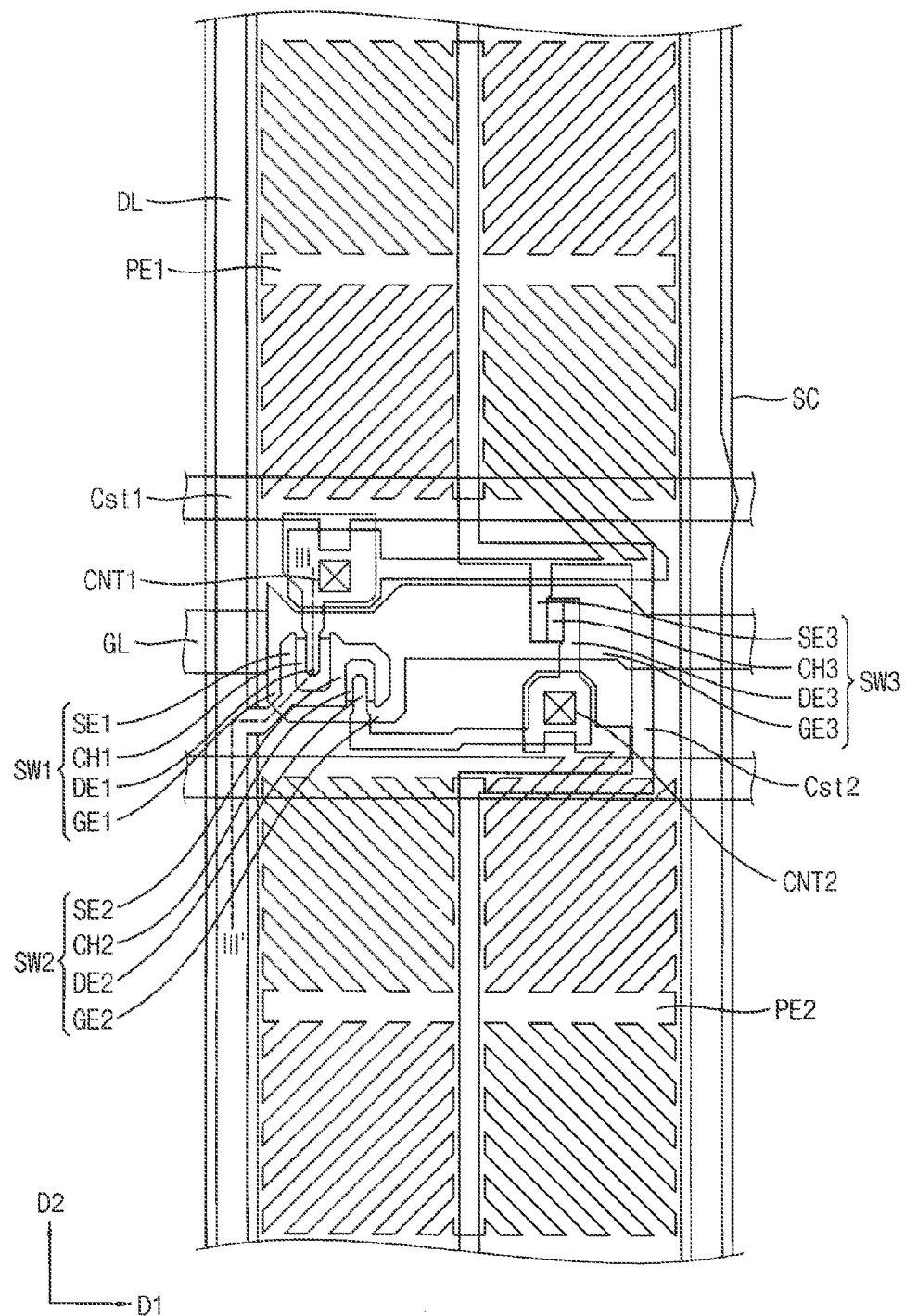
FIG. 17 is a plan view illustrating a display substrate according to an exemplary embodiment.
Figure 18:
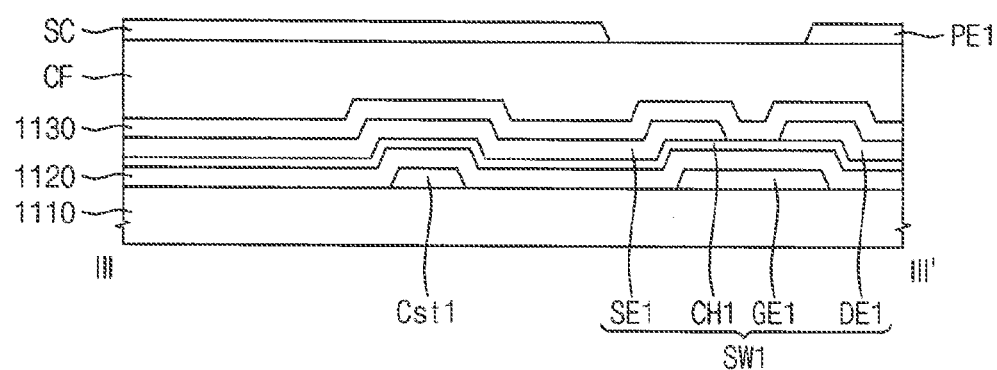
FIG. 18 is a cross-sectional view taken along line III-III' of FIG. 17.

FIG. 17 is a plan view illustrating a display substrate according to an exemplary embodiment. FIG. 18 is a cross-sectional view taken along line III-III' of FIG. 17.

Referring to FIGS. 17 and 18, a display substrate includes a gate line GL, a data line DL, a first storage line Cst1, a second storage line Cst2, a shielding electrode SC, a first switching element SW1, a second switching element SW2, a third switching element SW3, a high-pixel electrode PE1, and a low-pixel electrode PE2.

The gate line GL extends in a first direction D1. The gate line GL may have a single layer structure including copper (Cu), silver (Ag), chrome (Cr), molybdenum (Mo), aluminum (Al), titanium (Ti), manganese (Mn), and a mixture thereof. Alternatively, the gate line GL may have a multi-layer structure having multiple layers including materials different from each other. For example, the gate line GL may include a copper layer and a titanium layer disposed on and/or under the copper layer. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first storage line Cst1 extends in the first direction D1. The first storage line Cst1 overlaps with the high-pixel electrode PE1. The first storage line Cst1 is formed from the same layer as the gate line GL. Thus, the first storage line Cst1 may be disposed on the same layer as the gate line GL. The first storage line Cst1 may have a single layer structure including copper (Cu), silver (Ag), chrome (Cr), molybdenum (Mo), aluminum (Al), titanium (Ti), manganese (Mn) and a mixture thereof. Alternatively, the first storage line Cst1 may have a multi layer structure having multiple layers including materials different each other. For example, the first storage line Cst1 may include a copper layer and a titanium layer disposed on and/or under the copper layer.

A first insulation layer 1120 is formed on the gate line GL and the first storage line Cst1. The first insulation layer 1120 may include an inorganic material such as silicon oxide (SiOx) and/or silicon nitride (SiNx). For example, the first insulation layer 1120 includes silicon oxide (SiOx), and may have a thickness of about 500 Å. Alternatively, the first insulation layer 1120 may include multiple layers including different materials from each other.

The data line DL is formed on first insulation layer 1120. The data line DL extends in a second direction D2 crossing the first direction D1. The data line DL crosses the gate line GL. The data line DL may have a single layer structure including copper (Cu), silver (Ag), chrome (Cr), molybdenum (Mo), aluminum (Al), titanium (Ti), manganese (Mn) and a mixture thereof. Alternatively, the data line DL may have a multi layer structure having multiple layers including materials different from each other. For example, the data line DL may include a copper layer and a titanium layer disposed on and/or under the copper layer. The data line DL may be electrically connected to a first source electrode SE1 of the first switching element SW1 and a second source electrode SE2 of the second switching element SW2.

The second storage line Cst2 is formed from the same layer as the data line DL. Thus, the second storage line Cst2 may be disposed on the same layer as the data line DL. The second storage line Cst2 may have a single layer structure including copper (Cu), silver (Ag), chrome (Cr), molybdenum (Mo), aluminum (Al), titanium (Ti), manganese (Mn), and a mixture thereof. Alternatively, the second storage line Cst2 may have a multi layer structure having multiple layers including materials different each other. For example, the second storage line Cst2 may include a copper layer and a titanium layer disposed on and/or under the copper layer. The second storage line Cst2 may be electrically connected to a third source electrode SE3 of the third switching element SW3.

A second insulation layer 1130 is formed on the data line DL and the second storage line Cst2. The second insulation layer 1130 may include an inorganic material such as silicon oxide (SiOx) and/or silicon nitride (SiNx). For example, the second insulation layer 1130 includes silicon oxide (SiOx), and may have a thickness of about 500 Å. Alternatively, the second insulation layer 1130 may include multiple layers including different materials from each other.

An organic layer CF is disposed on the second insulation layer 1130. The organic layer CF may planarize an upper surface of the substrate, so as to prevent disconnection of a signal line. The organic layer CF may be an insulation layer including an organic material. For example, the organic layer CF may a color filter layer.

A shielding electrode SC is disposed on the organic layer CF. The shielding electrode SC may include a transparent conductive material, such as indium tin oxide (ITO) and indium zinc oxide (IZO). In addition, the shielding electrode SC may include titanium (Ti) and/or molybdenum titanium (MoTi).

A display panel according to an exemplary embodiment may include a display substrate, a facing substrate facing the display substrate, and liquid crystal layer interposed between the display substrate and the facing substrate. The facing substrate may include a common electrode. The common electrode is formed on an entire region of the facing substrate and may include a transparent conductive material. A common voltage is applied to the common electrode. The common voltage may be applied to the shielding electrode SC. When the common voltage is applied to the shielding electrode SC, liquid crystal molecules disposed on the shielding electrode SC may be aligned in a vertical direction. Thus, a direction of the liquid crystal molecules may be equal to a direction of a polarizer, so that a region on the shielding electrode SC may be black. Accordingly, a light may be blocked without a black matrix.

The high-pixel electrode PE1 and the low-pixel electrode PE2 may be formed from the same layer as the shielding electrode SC. The high-pixel electrode PE1 and the low-pixel electrode PE2 may include a transparent conductive material, such as indium tin oxide (ITO) and indium zinc oxide (IZO). In addition, the high-pixel electrode PE1 and the low-pixel electrode PE2 may include titanium (Ti) and/or molybdenum titanium (MoTi).

The high-pixel electrode PE1 is disposed adjacent to the gate line GL in the second direction D2, and between the data lines DL. The high-pixel electrode PE1 is electrically connected to a first drain electrode DE1 of the first switching element SW1 through a first contact hole CNT1.

The low-pixel electrode PE2 is disposed opposite to the high-pixel electrode PE1 with reference to the gate line GL, and between the data lines DL. The low-pixel electrode PE2 is electrically connected to the second drain electrode DE2 of the second switching element SW2 and the third drain electrode DE3 of the third switching element SW3 through a second contact hole CNT2.

A first voltage may be applied to the high-pixel electrode PE1. A second voltage different from the first voltage may be applied to the low-pixel electrode PE2. For example, the first voltage may be higher than the second voltage. A portion of the pixel corresponding to the high-pixel electrode PE1 may be driven as a high pixel, and another portion of the pixel corresponding to the low-pixel electrode PE2 may be driven as a low pixel.

The first switching element SW1 includes the first gate electrode GE1, the first source electrode SE1, the first drain electrode DE1, and a first channel portion CH1 connecting the first source electrode SE1 to the first drain electrode DEL The first channel portion CH1 may include a semiconductor layer including amorphous silicon (a-Si:H) and an ohmic contact layer including n+ amorphous silicon (n+ a-Si:H). The first channel portion CH1 may include an oxide semiconductor. The oxide semiconductor may include an amorphous oxide including at least one of indium (In), zinc (Zn), gallium (Ga), tin (Sn), and hafnium (Hf).

The second switching element SW2 includes the second gate electrode GE2, the second source electrode SE2, the second drain electrode DE2, and a second channel portion CH2 connecting the second source electrode SE2 to the second drain electrode DE2.

The second channel portion CH2 may include a semiconductor layer including amorphous silicon (a-Si:H) and an ohmic contact layer including n+ amorphous silicon (n+ a-Si:H). The second channel portion CH2 may include an oxide semiconductor. The oxide semiconductor may include an amorphous oxide including at least one of indium (In), zinc (Zn), gallium (Ga), tin (Sn), and hafnium (Hf).

The third switching element SW3 includes the third gate electrode GE3, the third source electrode SE3, the third drain electrode DE3 and a third channel portion CH3 connecting the third source electrode SE3 to the third drain electrode DE3.

The third channel portion CH3 may include a semiconductor layer including amorphous silicon (a-Si:H) and an ohmic contact layer including n+ amorphous silicon (n+ a-Si:H). The third channel portion CH3 may include an oxide semiconductor. The oxide semiconductor may include an amorphous oxide including at least one of indium (In), zinc (Zn), gallium (Ga), tin (Sn), and hafnium (Hf).

FIGS. 19 to 22 are cross-sectional views illustrating a method of manufacturing the display substrate of FIG. 18.

Figure 19:
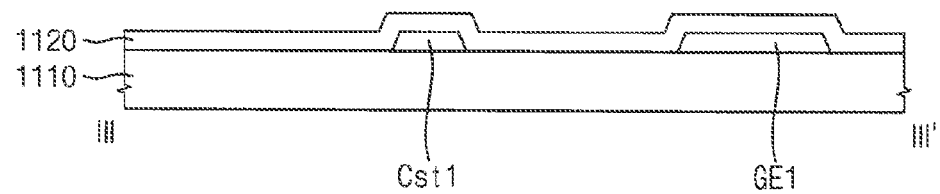
FIG. 19, FIG. 20, FIG. 21, and FIG. 22 are cross-sectional views illustrating a method of manufacturing the display substrate of FIG. 18.

Referring to FIG. 19, a gate metal layer is formed on a base substrate 1110, and then the gate metal layer may be partially etched by a photolithography process or an etching process using an additional etching mask, to form the gate pattern. The gate pattern includes a first storage line Cst1, a gate line GL, a first gate electrode GE1, a second gate electrode GE2, and a third gate electrode GE3.

The base substrate 1110 may include a material having relatively high transmittance, thermal resistance, and chemical resistance. For example, the base substrate 1110 may include any one of glass, polyethylenenaphthalate, polyethylene terephthalate, polyacryl, and a mixture thereof.

The gate pattern may include a metal, a metal alloy, a metal nitride, a conductive metal oxide, a transparent conductive material, and etc. For example, the gate pattern may include copper (Cu), which is opaque.

The first insulation layer 1120 is disposed on the gate pattern. The first insulation layer 1120 covers and insulates the first storage line Cst1, the gate line GL, the first gate electrode GE1, the second gate electrode GE2, and the third gate electrode GE3.

Figure 20:
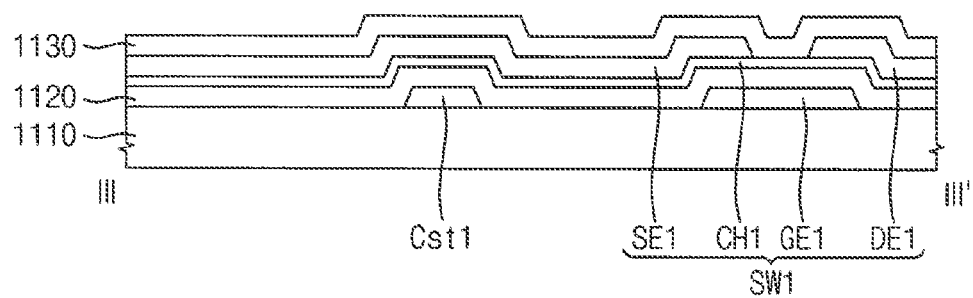

Referring to FIG. 20, a semiconductor layer and a data metal layer are disposed on the first insulation layer 1120. Thereafter, the semiconductor layer and the data metal layer may be partially etched by a photolithography process or an etching process using an additional etching mask, to form a channel layer including a first channel portion CH1 and a data metal pattern.

The channel layer may include a silicon semiconductor layer including amorphous silicon (a-Si:H) and an ohmic contact layer including n+ amorphous silicon (n+ a-Si:H). The channel layer may include an oxide semiconductor. The oxide semiconductor may include an amorphous oxide including at least one of indium (In), zinc (Zn), gallium (Ga), tin (Sn), and hafnium (Hf).

The data metal pattern have a single layer structure including copper (Cu), silver (Ag), chrome (Cr), molybdenum (Mo), aluminum (Al), titanium (Ti), manganese (Mn), and a mixture thereof. Alternatively, the data metal pattern may have a multi layer structure having multiple layers including materials different each other.

A second insulation layer 1130 is disposed on the data metal pattern and the channel layer. The second insulation layer 1130 may be formed by a spin coating process, a printing process, a sputtering process, a CVD process, an ALD process, a PECVD process, an HDP-CVD process, or a vacuum evaporation process, in accordance with ingredients included in the second insulation layer 1130. The second insulation layer 1130 is disposed on the data pattern. The second insulation layer 1130 covers and insulates the first drain electrode DE1, the first source electrode SE1, the second source electrode SE2, the second drain electrode DE2, the third source electrode SE3, the third drain electrode DE3, and the data line DL.

Figure 21:
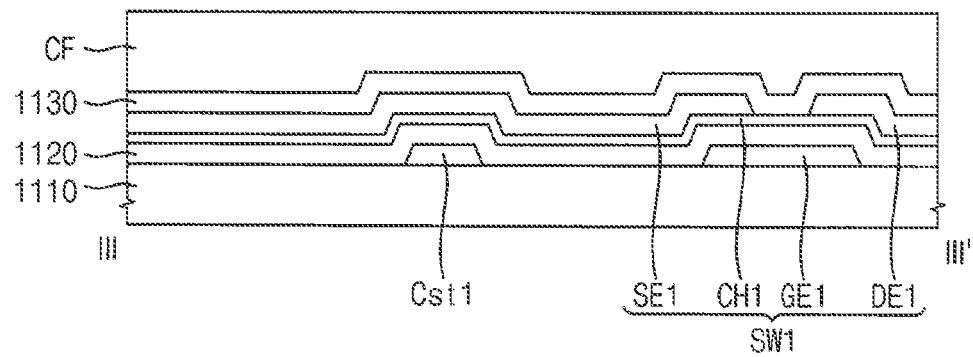

Referring to FIG. 21, an organic layer CF is disposed on the second insulation layer 1130. The organic layer CF may be a color filter layer. A photoresist is formed on the second insulation layer 130, and then the photoresist is exposed using a mask, and then the photoresist is developed using a developing solution, to form the organic layer CF.

The organic layer CF is disposed on the second insulation layer 1130. When the organic layer CF is the color filter layer, the color filter layer may supply colors to light passing through the liquid crystal layer. The color filter layer may include a red color filter layer, a green color filter layer, and blue color filter layer. The color filter layer corresponds to a unit pixel. The color filter layers adjacent to each other may have different colors. The color filter layer may be overlapped with adjacent color filter layer in a boundary of the adjacent unit pixels. In addition, the color filter layer may be spaced apart from adjacent color filter layer in the boundary of the adjacent unit pixels.

Figure 22:
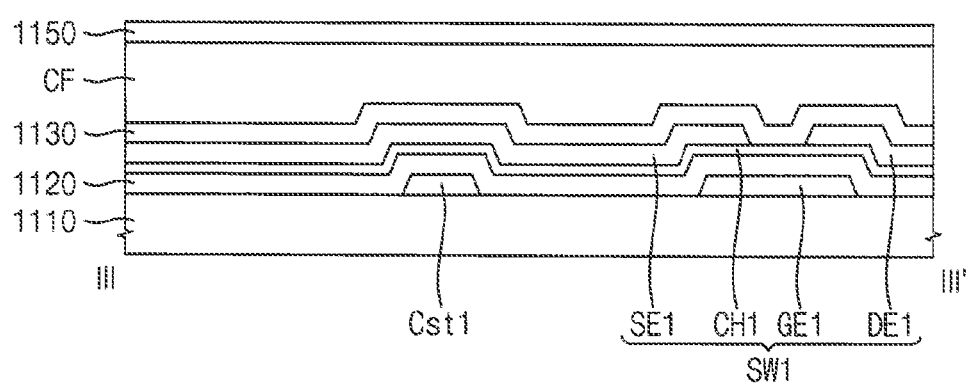

Referring to FIG. 22, a transparent conductive layer 1150 is disposed on the organic layer CF. The transparent conductive layer 1150 may include a transparent conductive material, such as indium tin oxide (ITO) and indium zinc oxide (IZO). In addition, the transparent conductive layer 1150 may include titanium (Ti) and/or molybdenum titanium (MoTi).

Referring back to FIG. 18, the transparent conductive layer 1150 is patterned to form the shielding electrode SC and the pixel electrode. The pixel electrode may include the high-pixel electrode PE1 and the low-pixel electrode PE2.

The shielding electrode SC may include a transparent conductive material, such as indium tin oxide (ITO) and indium zinc oxide (IZO). In addition, the shielding electrode SC may include titanium (Ti) and/or molybdenum titanium (MoTi).

The high-pixel electrode PE1 and the low-pixel electrode PE2 may be formed from the same layer as the shielding electrode SC. The high-pixel electrode PE1 and the low-pixel electrode PE2 may include a transparent conductive material, such as indium tin oxide (ITO) and indium zinc oxide (IZO). In addition, the high-pixel electrode PE1 and the low-pixel electrode PE2 may include titanium (Ti) and/or molybdenum titanium (MoTi).

Figure 23:
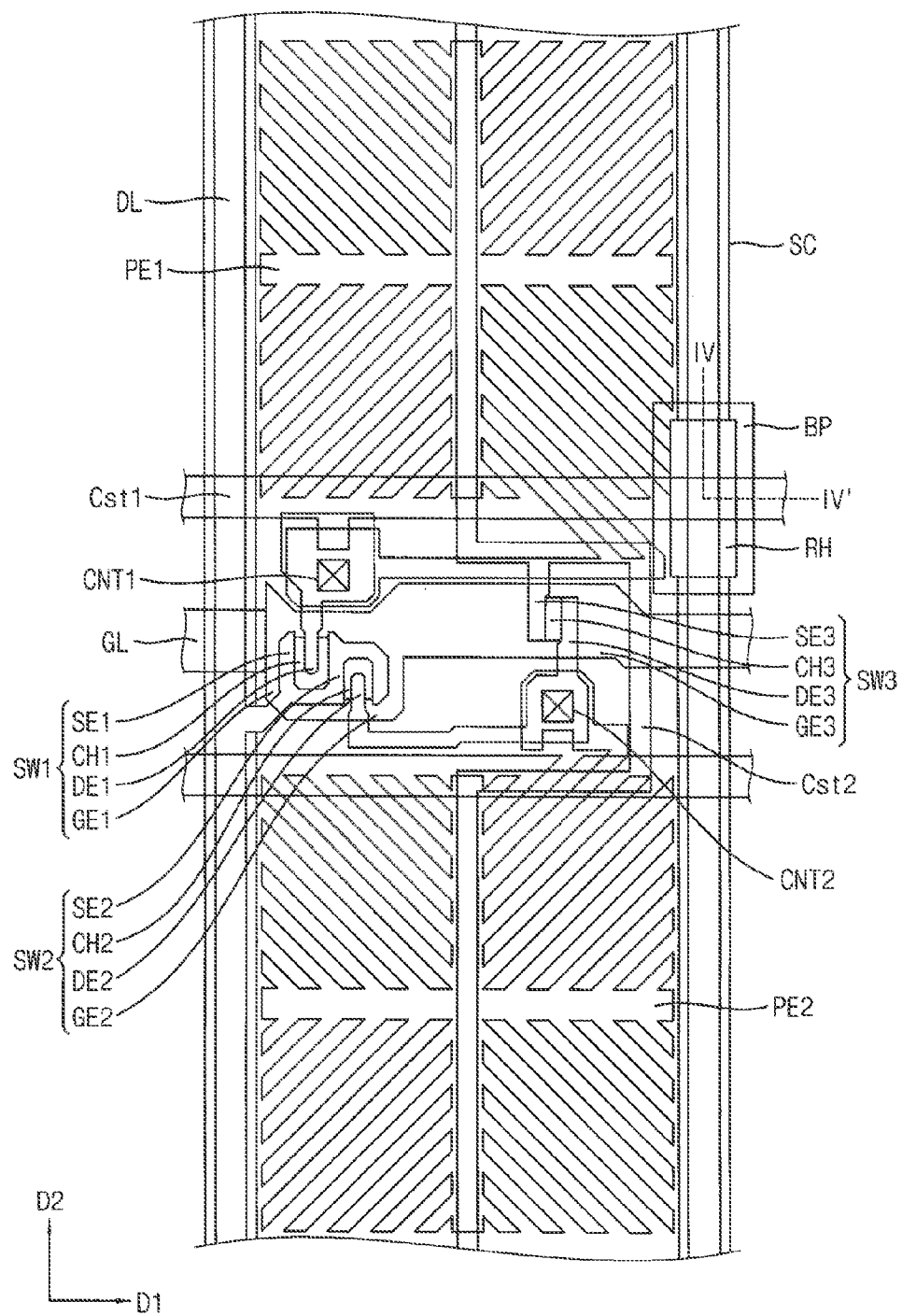
FIG. 23 is a plan view illustrating a display substrate repaired by a method of repairing a display substrate according to an exemplary embodiment.
Figure 24:
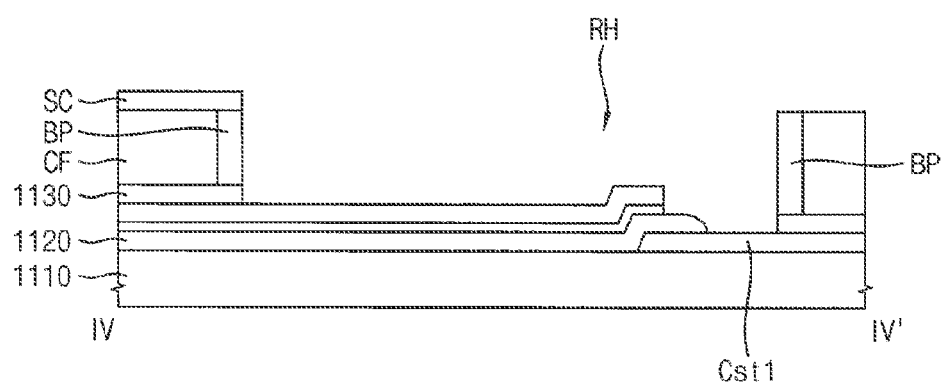
FIG. 24 is a cross-sectional view taken along line IV-IV' of FIG. 23.

FIG. 23 is a plan view illustrating a display substrate repaired by a method of repairing a display substrate according to an exemplary embodiment. FIG. 24 is a cross-is sectional view taken along line IV-IV' of FIG. 23

FIGS. 23 and 24 illustrate a repaired display substrate, of which a defect therein may have been caused by shorting between the data line DL and the first storage line Cst1.

A display substrate repaired by a method according to an exemplary embodiment includes a gate line GL, a data line DL, a first storage line Cst1, a second storage line Cst2, a shielding electrode SC, a first switching element SW1, a second switching element SW2, a third switching element SW3, a high-pixel electrode PE1, a low-pixel electrode PE2, a repair hole RH, and a light-blocking portion BP.

A display substrate according to an exemplary embodiment includes the data line DL and the first storage line Cst1 having a defect caused by shorting between the data line DL and the first storage line Cst1.

The repair hole RH is formed through the organic layer CF. The repair hole RH is formed by removing a portion of the organic layer CF. The repair hole RH may be formed by using a laser, more particularly, an ultra-fast laser. For example, the ultra-fast laser may be a pico-second laser, a femto-second laser, or an atto-second laser.

When an organic layer CF is disposed on the same substrate as the gate metal pattern and the data metal pattern, the organic layer CF may cover the gate metal pattern and the data metal pattern, which may render repairing the gate metal pattern or the data metal pattern difficult. Accordingly, the gate metal pattern or the data metal pattern having defects may be repaired, after removing the organic layer CF by using a laser. However, when the organic layer CF is removed by using a nano-second laser, selective removing of the organic layer CF may be difficult, which may render exquisite repairing of the gate metal pattern or the data metal pattern having defects difficult.

According to an exemplary embodiment, a method of repairing a display substrate uses an ultra-fast laser for removing the organic layer CF, which may selectively remove the organic layer CF. Accordingly, since selective removing of the organic layer CF overlapping the gate metal pattern or the data metal pattern having defects may be possible, defects of display substrate may be repaired exquisitely.

The repair hole RH may expose the gate metal pattern or the data metal pattern having defects. In the present exemplary embodiment, the data line DL and the first storage line Cst1 having defects caused by shorting may be partially exposed.

After the data line DL and the first storage line Cst1 having defects caused by shorting are partially exposed, a shorting point may be cut by using a laser. A process of cutting the shorting point may be performed by using an ultra-fast laser. For example, the ultra-fast laser may be a pico-second laser, a femto-second laser, or an atto-second laser.

The data line DL disposed on the first storage line Cst1 is removed to repair the defects between the data line DL and the first storage line Cst1.

After the data line DL disposed on the first storage line Cst1 is removed, a light-blocking portion BP is formed in a peripheral area of the repair hole RH. A laser is irradiated onto the organic layer CF adjacent to the repair hole RH to form the light-blocking portion BP. The light-blocking portion BP is formed by using an ultra-fast laser. For example, the ultra-fast laser may be a pico-second laser, a femto-second laser, or an atto-second laser.

When the organic layer CF is carbonized by a laser, the light-blocking portion BP may be formed. The laser may be irradiated onto the organic layer CF continuously or discontinuously. A degree of carbonization of the organic layer CF may vary depending on quantity, repetition rate, wave length, or pulse width of a laser. The light-blocking portion BP may have a black color, and thus may block light. The light-blocking portion BP is disposed on the same layer as the organic layer CF.

When the organic layer CF is selectively removed, the repair hole RH may be formed, which may cause light leakage through the selectively removed portion. However, a method of repairing a display substrate according to an exemplary embodiment includes forming the light-blocking portion BP. Thus, light leaked through the repair hole RH may be blocked. Forming the light-blocking portion BP may be omitted, when light leaked through the repair hole RH may be insignificant.

Figure 25:
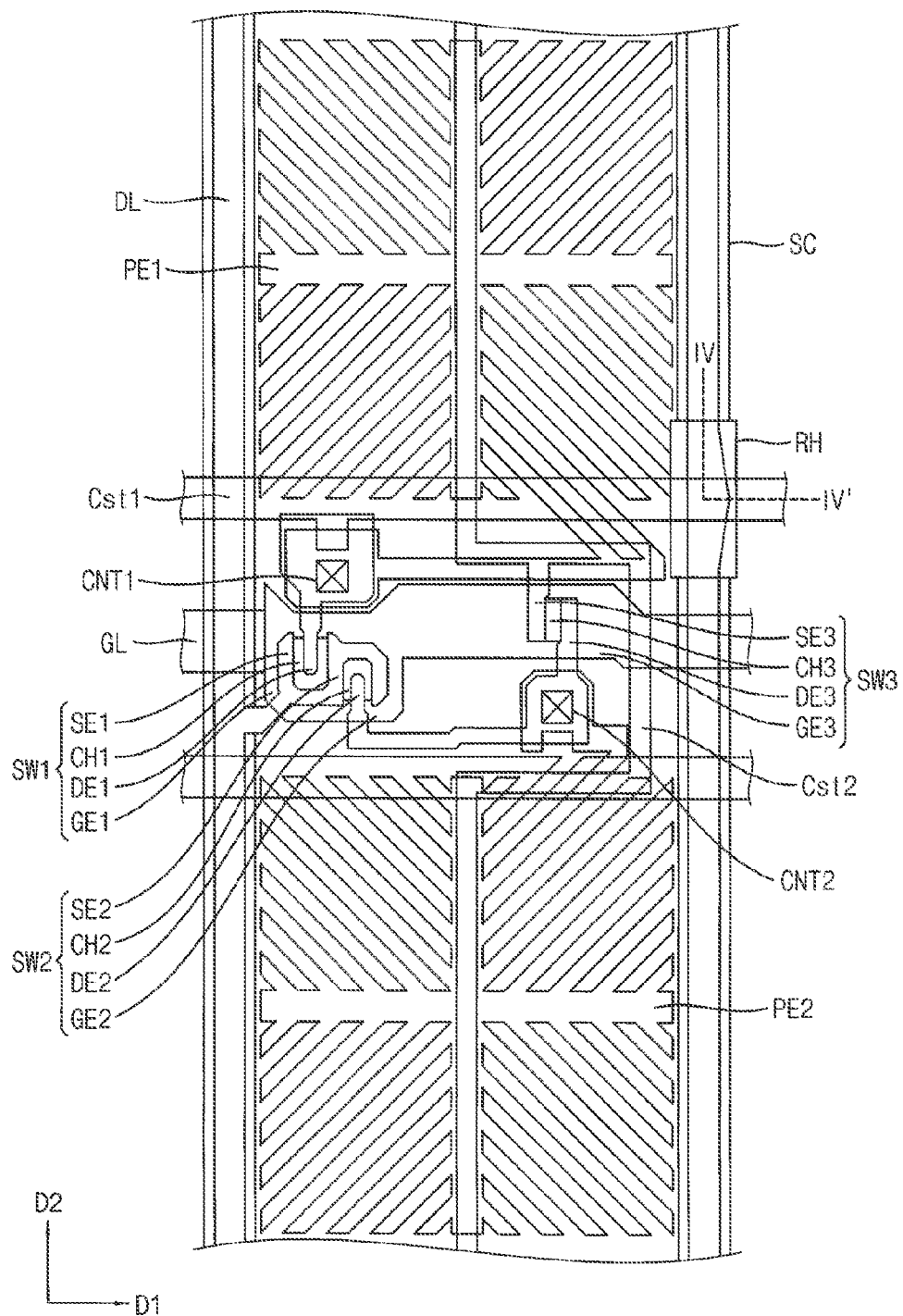
FIG. 25 is a plan view illustrating a display substrate repaired by a method of repairing a display substrate of FIG. 23.
Figure 26:
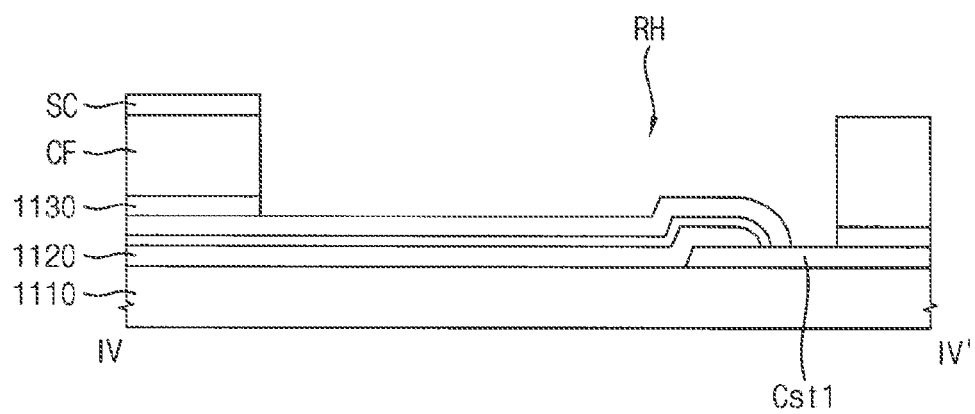
FIG. 26 is a cross-sectional view taken along line IV-IV' of FIG. 25.

FIG. 25 is a plan view illustrating a display substrate repaired by a method of repairing a display substrate of FIG. 23. FIG. 26 is a cross-sectional view taken along line IV-IV' of FIG. 25.

Referring to FIGS. 25 and 26, a portion of the organic layer CF is removed to form a repair hole RH, through which the data line DL and the first storage line Cst1 having a defect may be exposed.

A portion of the organic layer CF is removed to form a repair hole RH exposing the data line DL and the first storage line Cst1 having a defect. The process of forming a repair hole RH may be performed by using an ultra-fast laser. For example, the ultra-fast laser may be a pico-second laser, a femto-second laser, or an atto-second laser.

The repair hole RH may expose the gate metal pattern or the data metal pattern having defects. In the present exemplary embodiment, exposing the data line DL and the first storage line Cst1 having defects caused by shorting may be partially exposed. A process of forming the repair hole RH may include irradiating an ultra-fast laser to the organic layer CF to remove a portion of the organic layer CF disposed on the data line DL and the first storage line Cst1, and to expose the data line DL and the first storage line Cst1 having defects.

Figure 27:
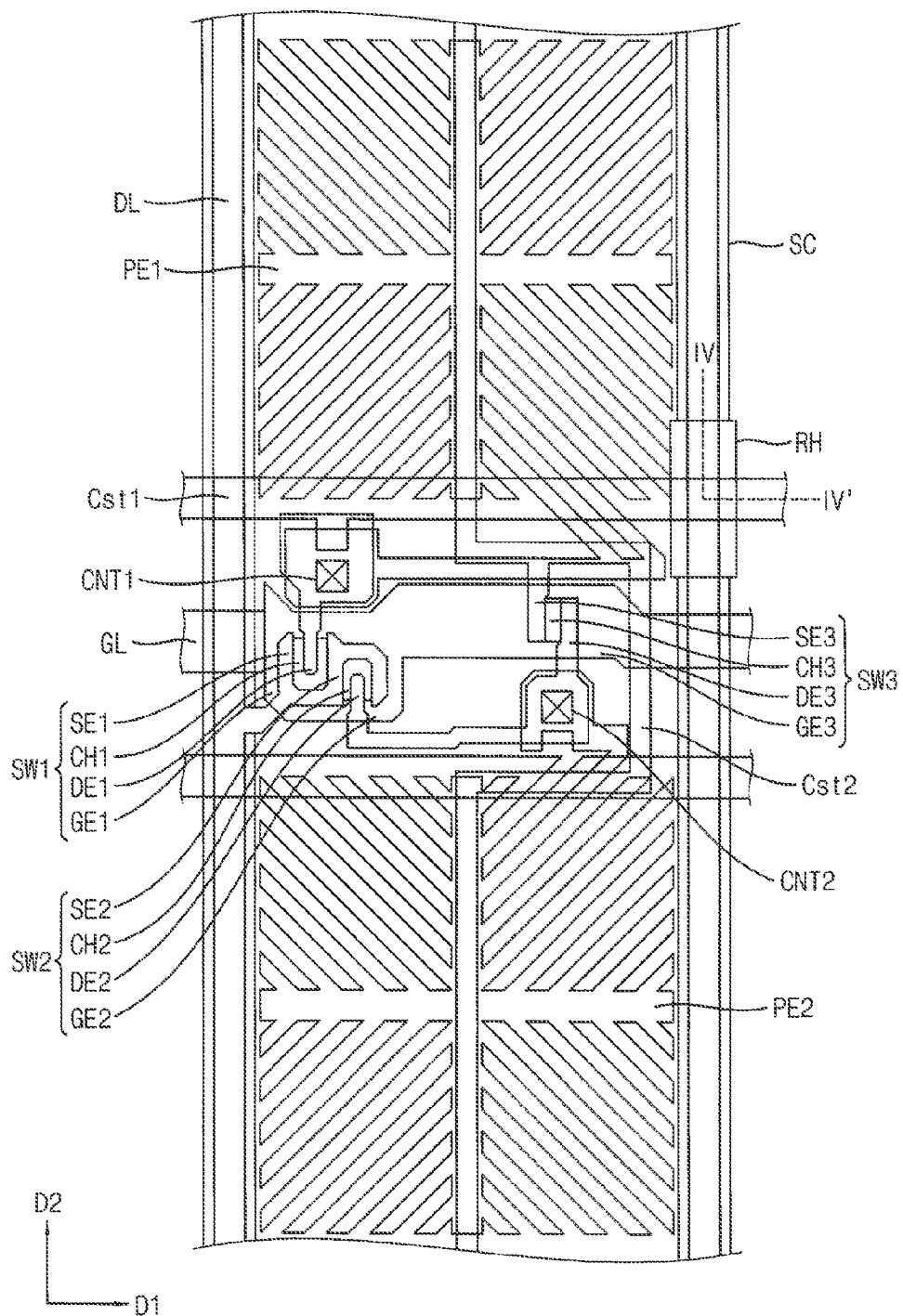
FIG. 27 is a plan view illustrating a display substrate repaired by a method of repairing a display substrate of FIG. 23.
Figure 28:
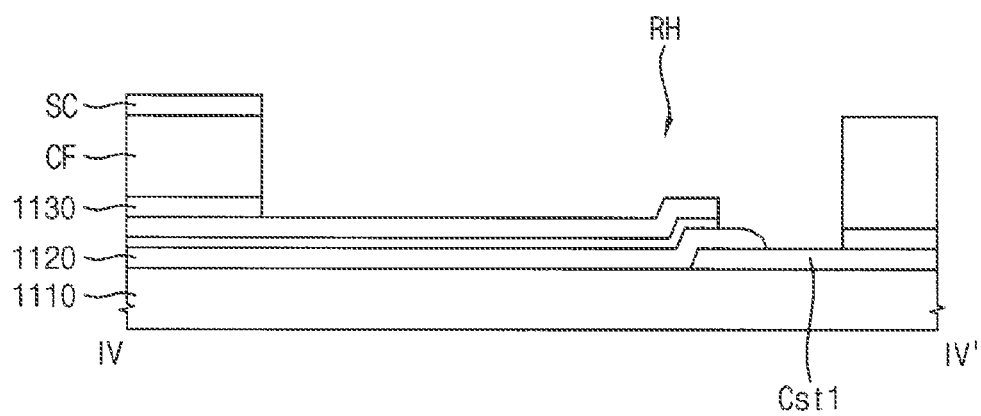
FIG. 28 is a cross-sectional view taken along line IV-IV' of FIG. 27.

FIG. 27 is a plan view illustrating a display substrate repaired by a method of repairing a display substrate of FIG. 23. FIG. 28 is a cross-sectional view taken along line IV-IV' of FIG. 27.

Referring to FIGS. 27 and 28, after the data line DL and the first storage line Cst1 having defects are exposed, a shorting point between the data line DL and the first storage line Cst1 may be cut.

After the data line DL and the first storage line Cst1 having defects are exposed, a shorting point between the data line DL and the first storage line Cst1 is cut. The process of cutting the shorting point is performed by using an ultra-fast laser. For example, the ultra-fast laser may be a pico-second laser, a femto-second laser, or an atto-second laser. The data line DL disposed on the first storage line Cst1 is removed to repair the defects between the data line DL and the first storage line Cst1.

Referring to back FIGS. 23 and 24, a light-blocking portion BP is formed in a peripheral area of the repair hole RH.

After the data line DL disposed on the first storage line Cst1 is removed, the light-blocking portion BP is formed in a peripheral area of the repair hole RH. A laser is irradiated onto the organic layer CF adjacent to the repair hole RH to form the light-blocking portion BP. The light-blocking portion BP is formed by using an ultra-fast laser. For example, the ultra-fast laser may be a pico-second laser, a femto-second laser, or an atto-second laser.

When the organic layer CF is carbonized by a laser, the light-blocking portion BP may be formed. The laser may be irradiated onto the organic layer CF continuously or discontinuously. A degree of carbonization of the organic layer CF may vary depending on quantity, repetition rate, wave length, or pulse width of a laser. The light-blocking portion BP may have a black color, and thus may block light. The light-blocking portion BP is disposed on the same layer as the organic layer CF.

When the organic layer CF is selectively removed, the repair hole RH may be formed, which may cause light leakage through a selectively removed portion. However, a method of repairing a display substrate according to an exemplary embodiment includes forming the light-blocking portion BP. Thus, light leaked through the repair hole RH may be blocked. Forming the light-blocking portion BP may be omitted, when light leaked through the repair hole RH may be insignificant.

Figure 29:
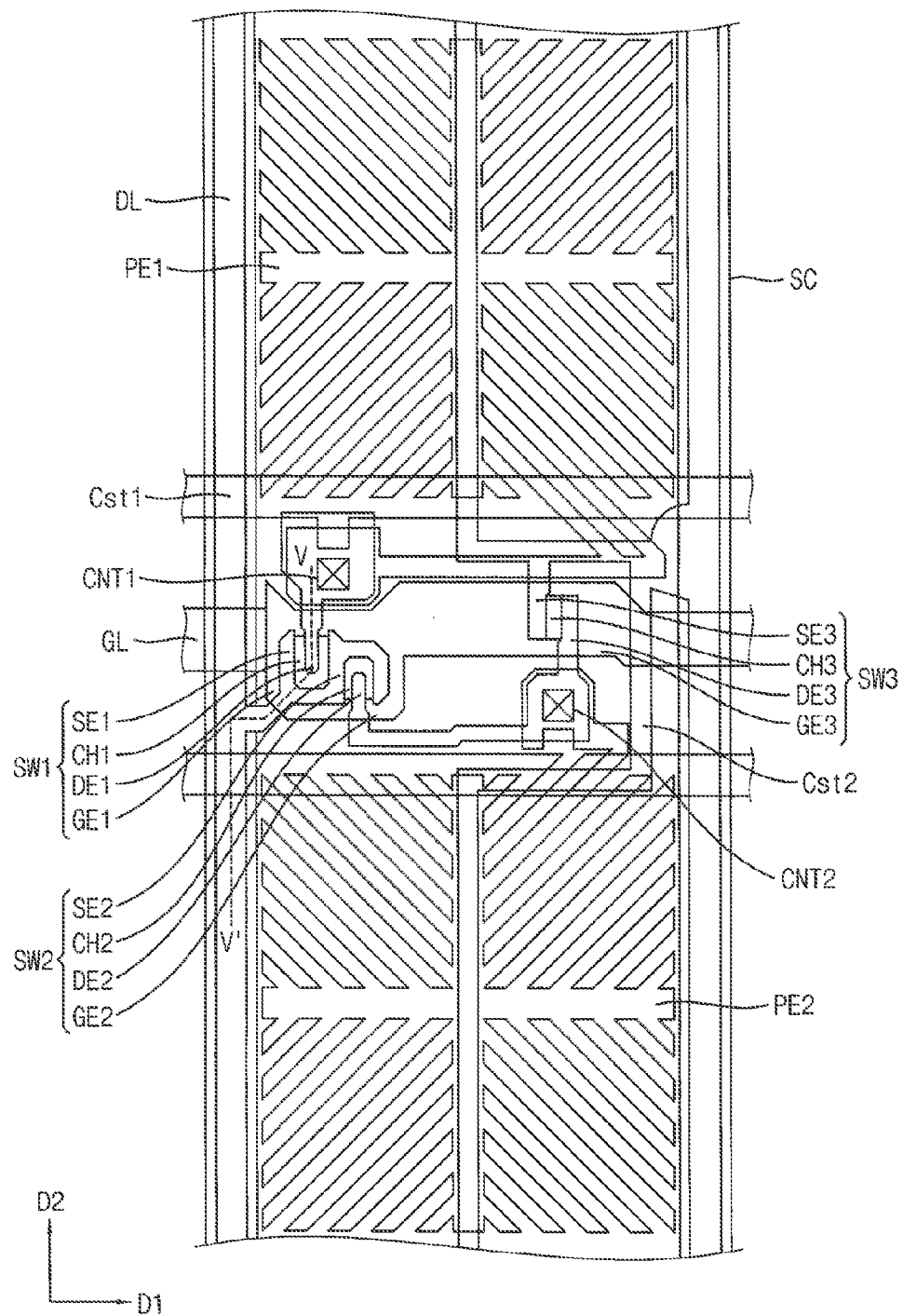
FIG. 29 is a plan view illustrating a display substrate according to an exemplary embodiment.
Figure 30:
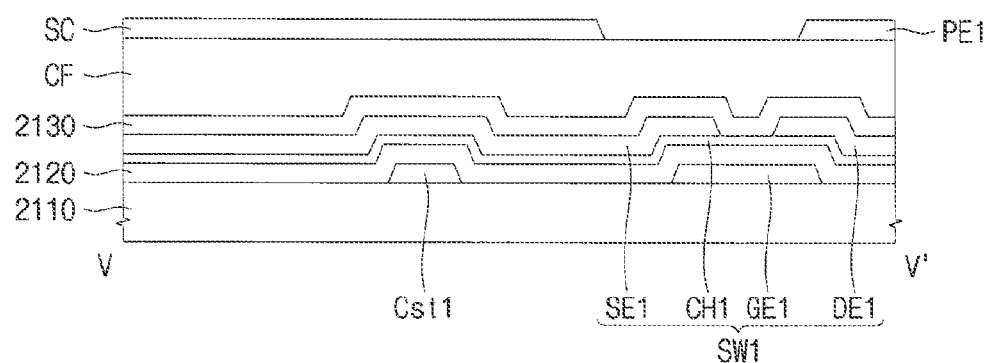
FIG. 30 is a cross-sectional view taken along line V-V' of FIG. 29.

FIG. 29 is a plan view illustrating a display substrate according to an exemplary embodiment. FIG. 30 is a cross-sectional view taken along line V-V' of FIG. 29.

Referring to FIGS. 29 and 30, a display substrate includes a gate line GL, a data line DL, a first storage line Cst1, a second storage line Cst2, a shielding electrode SC, a first switching element SW1, a second switching element SW2, a third switching element SW3, a high-pixel electrode PE1, and a low-pixel electrode PE2.

The gate line GL extends in a first direction D1. The gate line GL may have a single layer structure including copper (Cu), silver (Ag), chrome (Cr), molybdenum (Mo), aluminum (Al), titanium (Ti), manganese (Mn), and a mixture thereof. Alternatively, the gate line GL may have a multi-layer structure having multiple layers including materials different from each other. For example, the gate line GL may include a copper layer and a titanium layer disposed on and/or under the copper layer. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first storage line Cst1 extends in the first direction D1. The first storage line Cst1 overlaps with the high-pixel electrode PE1. The first storage line Cst1 is formed from the same layer as the gate line GL. Thus, the first storage line Cst1 may be disposed on the same layer as the gate line GL. The first storage line Cst1 may have a single layer structure including copper (Cu), silver (Ag), chrome (Cr), molybdenum (Mo), aluminum (Al), titanium (Ti), manganese (Mn), and a mixture thereof. Alternatively, the first storage line Cst1 may have a multi layer structure having multiple layers including materials different each other. For example, the first storage line Cst1 may include a copper layer and a titanium layer disposed on and/or under the copper layer.

A first insulation layer 2120 is formed on the gate line GL and the first storage line Cst1. The first insulation layer 2120 may include an inorganic material such as silicon oxide (SiOx) and/or silicon nitride (SiNx). For example, the first insulation layer 2120 includes silicon oxide (SiOx), and may have a thickness of about 500 Å. In addition, the first insulation layer 2120 may include multiple layers including different materials from each other.

The data line DL is formed on first insulation layer 2120. The data line DL extends in a second direction D2 crossing the first direction D1. The data line DL crosses the gate line GL. The data line DL may have a single layer structure including copper (Cu), silver (Ag), chrome (Cr), molybdenum (Mo), aluminum (Al), titanium (Ti), manganese (Mn), and a mixture thereof. Alternatively, the data line DL may have a multi layer structure having a multiple layers including materials different each other. For example, the data line DL may include a copper layer and a titanium layer disposed on and/or under the copper layer. The data line DL may be electrically connected to a first source electrode SE1 of the first switching element SW1 and a second source electrode SE2 of the second switching element SW2.

The second storage line Cst2 is formed from the same layer as the data line DL. Thus, the second storage line Cst2 may be disposed on the same layer as the data line DL. The second storage line Cst2 may have a single layer structure including copper (Cu), silver (Ag), chrome (Cr), molybdenum (Mo), aluminum (Al), titanium (Ti), manganese (Mn), and a mixture thereof. Alternatively, the second storage line Cst2 may have a multi layer structure having multiple layers including materials different each other. For example, the second storage line Cst2 may include a copper layer and a titanium layer disposed on and/or under the copper layer. The second storage line Cst2 may be electrically connected to a third source electrode SE3 of the third switching element SW3.

A second insulation layer 2130 is formed on the data line DL and the second storage line Cst2. The second insulation layer 2130 may include an inorganic material such as silicon oxide (SiOx) and/or silicon nitride (SiNx). For example, the second insulation layer 2130 includes silicon oxide (SiOx), and may have a thickness of about 500 Å. In addition, the second insulation layer 2130 may include multiple layers including different materials from each other.

An organic layer CF is disposed on the second insulation layer 2130. The organic layer CF may planarize an upper surface of the substrate, so as to prevent disconnection of a signal line. The organic layer CF may be an insulation layer including an organic material. For example, the organic layer CF may a color filter layer.

A shielding electrode SC is disposed on the organic layer CF. The shielding electrode SC may include a transparent conductive material, such as indium tin oxide (no) and indium zinc oxide (IZO). In addition, the shielding electrode SC may include titanium (Ti) and/or molybdenum titanium (MoTi).

A display panel according to an exemplary embodiment may include a display substrate, a facing substrate facing the display substrate, and liquid crystal layer interposed between the display substrate and the facing substrate. The facing substrate may include a common electrode. The common electrode is formed on an entire region of the facing substrate and may include a transparent conductive material. A common voltage is applied to the common electrode. The common voltage may be applied to the shielding electrode SC. When the common voltage is applied to the shielding electrode SC, liquid crystal molecules disposed on the shielding electrode SC may be aligned in a vertical direction. Thus, a direction of the liquid crystal molecules may be equal to a direction of a polarizer, so that a region on the shielding electrode SC may be black. Accordingly, a light may be blocked without a black matrix.

The high-pixel electrode PE1 and the low-pixel electrode PE2 may be formed from the same layer as the shielding electrode SC. The high-pixel electrode PE1 and the low-pixel electrode PE2 may include a transparent conductive material, such as indium tin oxide (ITO) and indium zinc oxide (IZO). In addition, the high-pixel electrode PE1 and the low-pixel electrode PE2 may include titanium (Ti) and/or molybdenum titanium (MoTi).

The high-pixel electrode PE1 is disposed adjacent to the gate line GL in the second direction D2, and between the data lines DL. The high-pixel electrode PE1 is electrically connected to a first drain electrode DE1 of the first switching element SW1 through a first contact hole CNT1.

The low-pixel electrode PE2 is disposed opposite to the high-pixel electrode PE1 with reference to the gate line GL, and between the data lines DL. The low-pixel electrode PE2 is electrically connected to the second drain electrode DE2 of the second switching element SW2 and the third drain electrode DE3 of the third switching element SW3 through a second contact hole CNT2.

A first voltage may be applied to the high-pixel electrode PE1. A second voltage different from the first voltage may be applied to the low-pixel electrode PE2. For example, the first voltage may be higher than the second voltage. A portion of the pixel corresponding to the high-pixel electrode PE1 may be driven as a high pixel, and another portion of the pixel corresponding to the low-pixel electrode PE2 may be driven as a low pixel.

The first switching element SW1 includes the first gate electrode GE1, the first source electrode SE1, the first drain electrode DE1, and a first channel portion CH1 connecting the first source electrode SE1 to the first drain electrode DE1.

The first channel portion CH1 may include a semiconductor layer including amorphous silicon (a-Si:H) and an ohmic contact layer including n+ amorphous silicon (n+ a-Si:H). The first channel portion CH1 may include an oxide semiconductor. The oxide semiconductor may include an amorphous oxide including at least one of indium (In), zinc (Zn), gallium (Ga), tin (Sn), and hafnium (Hf).

The second switching element SW2 includes the second gate electrode GE2, the second source electrode SE2, the second drain electrode DE2, and a second channel portion CH2 connecting the second source electrode SE2 to the second drain electrode DE2.

The second channel portion CH2 may include a semiconductor layer including amorphous silicon (a-Si:H) and an ohmic contact layer including n+ amorphous silicon (n+ a-Si:H). The second channel portion CH2 may include an oxide semiconductor. The oxide semiconductor may include an amorphous oxide including at least one of indium (In), zinc (Zn), gallium (Ga), tin (Sn), and hafnium (Hf).

The third switching element SW3 includes the third gate electrode GE3, the third source electrode SE3, the third drain electrode DE3, and a third channel portion CH3 connecting the third source electrode SE3 to the third drain electrode DE3.

The third channel portion CH3 may include a semiconductor layer including amorphous silicon (a-Si:H) and an ohmic contact layer including n+ amorphous silicon (n+ a-Si:H). In addition, the third channel portion CH3 may include an oxide semiconductor. The oxide semiconductor may include an amorphous oxide including at least one of indium (In), zinc (Zn), gallium (Ga), tin (Sn), and hafnium (Hf).

FIGS. 31 to 34 are cross-sectional views illustrating a method of manufacturing the display substrate of FIG. 30.

Figure 31:
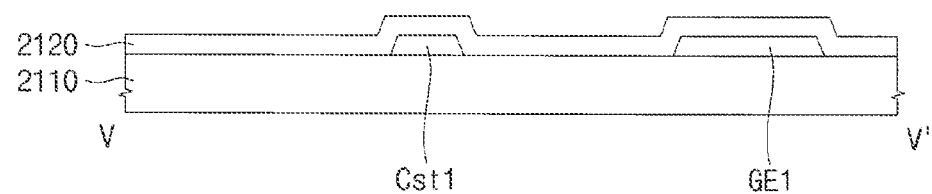
FIG. 31, FIG. 32, FIG. 33, and FIG. 34 are cross-sectional views illustrating a method of manufacturing the display substrate of FIG. 30.

Referring to FIG. 31, a gate metal layer is formed on a base substrate 2110. The gate metal layer may then be partially etched by a photolithography process or an etching process using an additional etching mask, to form the gate pattern. The gate pattern includes a first storage line Cst1, a gate line GL, a first gate electrode GE1, a second gate electrode GE2, and a third gate electrode GE3.

The base substrate 2110 may include a material having relatively high transmittance, thermal resistance, and chemical resistance. For example the base substrate 2110 may include any one of glass, polyethylenenaphthalate, polyethylene terephthalate, polyacryl, and a mixture thereof.

The gate pattern may include a metal, a metal alloy, a metal nitride, a conductive metal oxide, a transparent conductive material, and etc. For example, the gate pattern may include copper (Cu), which is opaque.

The first insulation layer 2120 is disposed on the gate pattern. The first insulation layer 2120 is disposed on the gate pattern. The first insulation layer 2120 covers and insulates the first storage line Cst1, the gate line GL, the first gate electrode GE1, the second gate electrode GE2, and the third gate electrode GE3.

Figure 32:
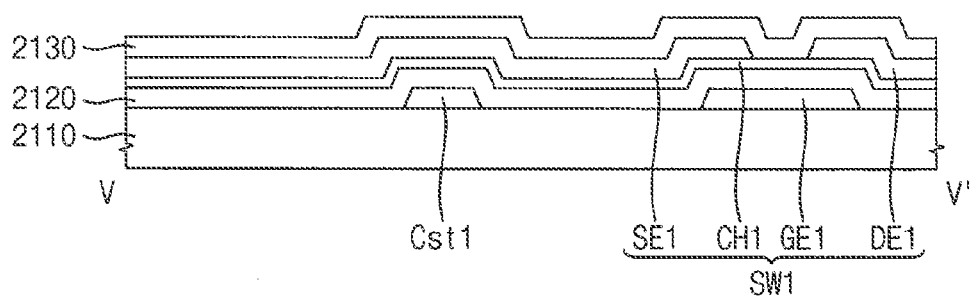

Referring to FIG. 32, a semiconductor layer and a data metal layer are disposed on the first insulation layer 2120. Thereafter, the semiconductor layer and the data metal layer may be partially etched by a photolithography process or an etching process using an additional etching mask, to form a channel layer including a first channel portion CH1 and a data metal pattern.

The channel layer may include a silicon semiconductor layer including amorphous silicon (a-Si:H) and an ohmic contact layer including n+ amorphous silicon (n+ a-Si:H). In addition, the channel layer may include an oxide semiconductor. The oxide semiconductor may include an amorphous oxide including at least one of indium (In), zinc (Zn), gallium (Ga), tin (Sn), and hafnium (Hf).

The data metal pattern have a single layer structure including copper (Cu), silver (Ag), chrome (Cr), molybdenum (Mo), aluminum (Al), titanium (Ti), manganese (Mn), and a mixture thereof. Alternatively, the data metal pattern may have a multi layer structure having multiple layers including materials different each other.

A second insulation layer 2130 is disposed on the data metal pattern and the channel layer. The second insulation layer 2130 may be formed by a spin coating process, a printing process, a sputtering process, a CVD process, an ALD process, a PECVD process, an HDP-CVD process, or a vacuum evaporation process, in accordance with ingredients included in the second insulation layer 2130. The second insulation layer 2130 is disposed on the data pattern. The second insulation layer 2130 covers and insulates the first drain electrode DE1, the first source electrode SE1, the second source electrode SE2, the second drain electrode DE2, the third source electrode SE3, the third drain electrode DE3, and the data line DL.

Figure 33:
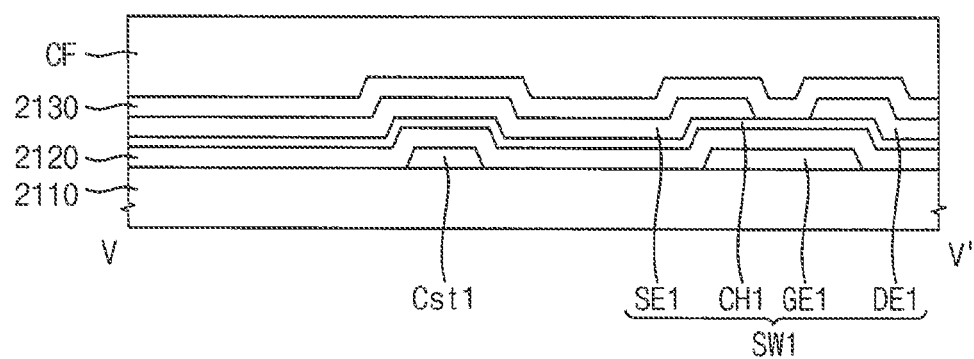

Referring to FIG. 33, an organic layer CF is disposed on the second insulation layer 2130. The organic layer CF may be a color filter layer. A photoresist is formed on the second insulation layer 2130, and then the photoresist is exposed using a mask, and then the photoresist is developed using a developing solution, to form the organic layer CF.

The organic layer CF is disposed on the second insulation layer 2130. When the organic layer CF is the color filter layer, the color filter layer may supply colors to the light passing through the liquid crystal layer. The color filter layer may include a red color filter layer, a green color filter layer, and blue color filter layer. The color filter layer corresponds to a unit pixel. The color filter layers adjacent to each other may have different colors. The color filter layer may be overlapped with adjacent color filter layer in a boundary of the adjacent unit pixels. In addition, the color filter layer may be spaced apart from adjacent color filter layer in the boundary of the adjacent unit pixels.

Figure 34:
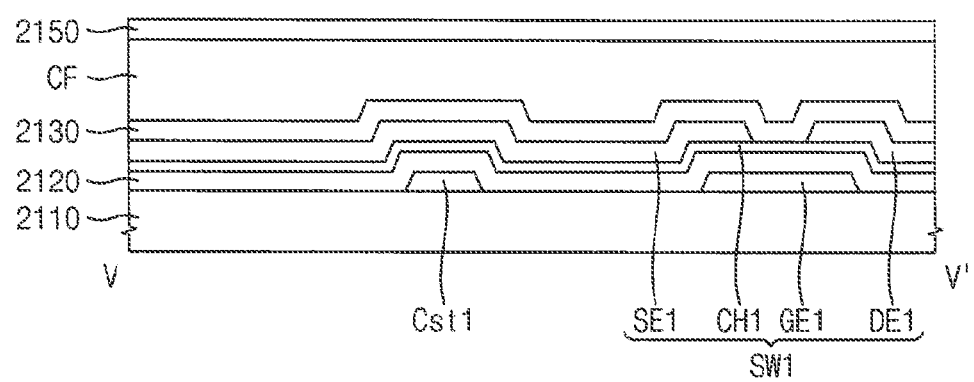

Referring to FIG. 34, a transparent conductive layer 2150 is disposed on the organic layer CF. The transparent conductive layer 2150 may include a transparent conductive material, such as indium tin oxide (ITO) and indium zinc oxide (IZO). In addition, the transparent conductive layer 2150 may include titanium (Ti) and/or molybdenum titanium (MoTi).

Referring back to FIG. 30, the transparent conductive layer 2150 is patterned to form the shielding electrode SC and the pixel electrode. The pixel electrode may include the high-pixel electrode PE1 and the low-pixel electrode PE2.

The shielding electrode SC may include a transparent conductive material, such as indium tin oxide (ITO) and indium zinc oxide (IZO). In addition, the shielding electrode SC may include titanium (Ti) and/or molybdenum titanium (MoTi).

The high-pixel electrode PE1 and the low-pixel electrode PE2 may be formed from the same layer as the shielding electrode SC. The high-pixel electrode PE1 and the low-pixel electrode PE2 may include a transparent conductive material, such as indium tin oxide (ITO) and indium zinc oxide (IZO). In addition, the high-pixel electrode PE1 and the low-pixel electrode PE2 may include titanium (Ti) and/or molybdenum titanium (MoTi).

Figure 35:
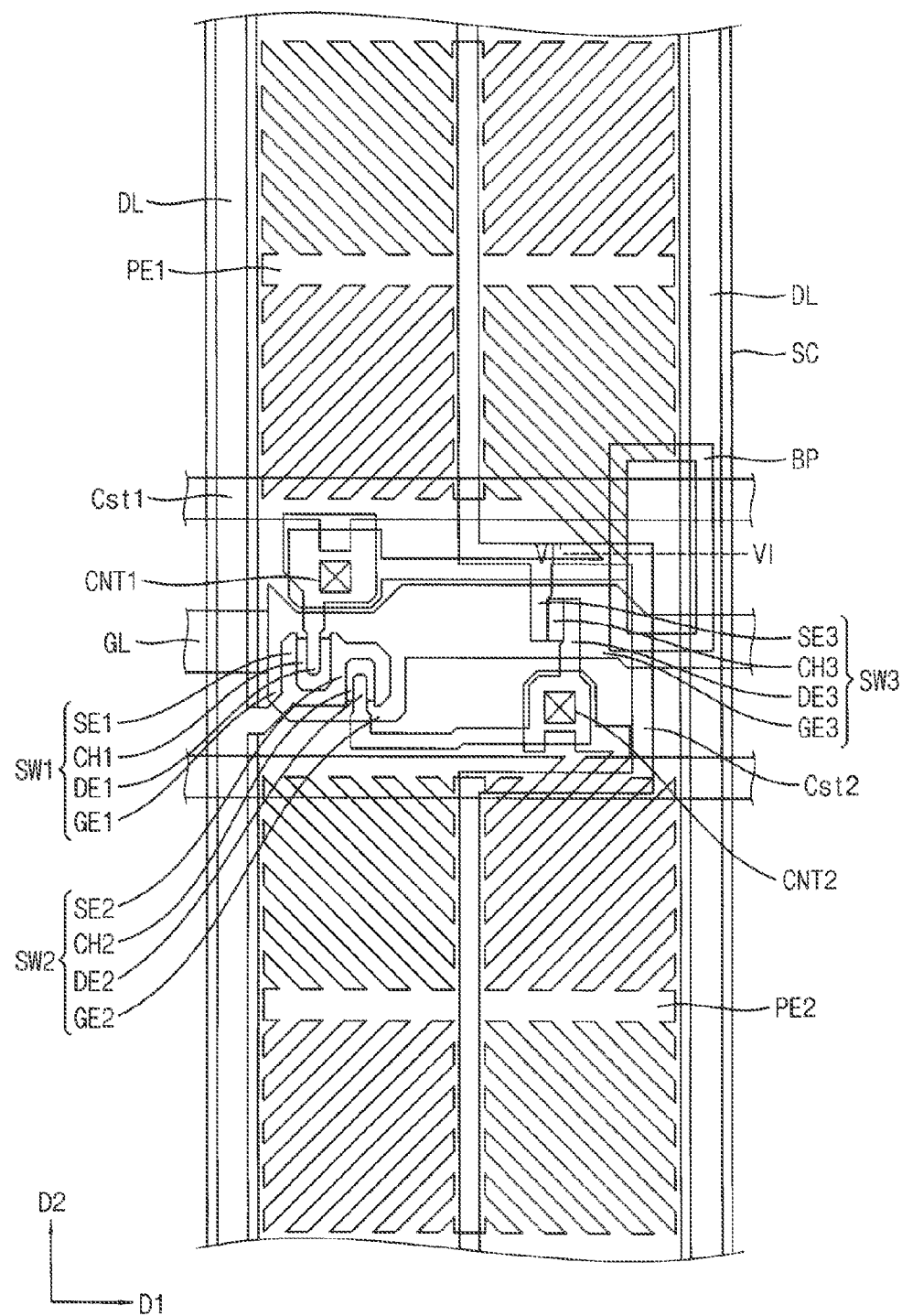
FIG. 35 is a plan view illustrating a display substrate repaired by a method of repairing a display substrate according to an exemplary embodiment.
Figure 36:
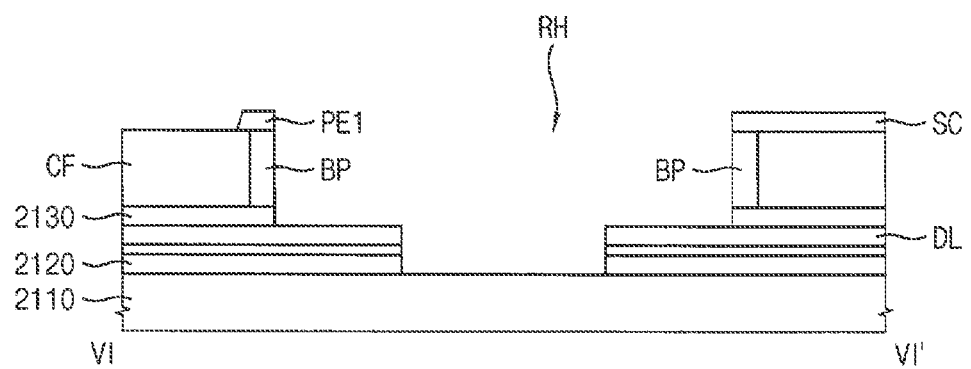
FIG. 36 is a cross-sectional view taken along line VI-VI' of FIG. 35.

FIG. 35 is a plan view illustrating a display substrate repaired by a method of repairing a display substrate according to an exemplary embodiment. FIG. 36 is a cross-sectional view taken along line VI-VI' of FIG. 35.

FIGS. 35 and 36 illustrate a repaired display substrate, of which a defect therein may have been caused by shorting between the data line DL and the second storage line Cst2.

A display substrate repaired by a method according to an exemplary embodiment includes a gate line GL, a data line DL, a first storage line Cst1, a second storage line Cst2, a shielding electrode SC, a first switching element SW1, a second switching element SW2, a third switching element SW3, a high-pixel electrode PE1, a low-pixel electrode PE2, a repair hole RH, and a light-blocking portion BP.

A display substrate according to an exemplary embodiment includes the data line DL and the second storage line Cst2 having a defect caused by shorting between the data line DL and the second storage line Cst2.

The repair hole RH is formed through the organic layer CF. The repair hole RH is formed by removing a portion of the organic layer CF. The repair hole RH may be formed by using a laser, more particularly, an ultra-fast laser. For example, the ultra-fast laser may be a pico-second laser, a femto-second laser, or an atto-second laser.

When an organic layer CF is disposed on the same substrate as the gate metal pattern and the data metal pattern, the organic layer CF may cover the gate metal pattern and the data metal pattern, which may increase the possibility of repair failure. Accordingly, the gate metal pattern or the data metal pattern having defects may be repaired, after removing the organic layer CF by using a laser. However, when the organic layer CF is removed by using a nano-second laser, selective removing of the organic layer CF may be difficult, which may render exquisite repairing of the gate metal pattern or the data metal pattern having defects difficult.

According to an exemplary embodiment, a method of repairing a display substrate uses an ultra-fast laser for removing the organic layer CF, which may selectively remove the organic layer CF. Accordingly, since selective removing of the organic layer CF overlapping the gate metal pattern or the data metal pattern having defects may be possible, defects of display substrate may be repaired exquisitely.

The repair hole RH may expose the gate metal pattern or the data metal pattern having defects. In the present exemplary embodiment, the data line DL and the second storage line Cst2 having defects caused by shorting may be partially exposed.

After the data line DL and the second storage line Cst2 having defects caused by shorting are partially exposed, a shorting point may be cut by using a laser. A process of cutting the shorting point may be performed by using an ultra-fast laser. For example, the ultra-fast laser may be a pico-second laser, a femto-second laser, or an atto-second laser.

The data line DL disposed on the second storage line Cst2 is removed to repair the defects between the data line DL and the second storage line Cst2.

After the data line DL disposed on the second storage line Cst2 is removed, a light-blocking portion BP is formed in a peripheral area of the repair hole RH. A laser is irradiated onto the organic layer CF adjacent to the repair hole RH, to form the light-blocking portion BP. The light-blocking portion BP is formed by using an ultra-fast laser. For example, the ultra-fast laser may be a pico-second laser, a femto-second laser, or an atto-second laser.

When the organic layer CF is carbonized by a laser, the light-blocking portion BP may be formed. The laser may be irradiated onto the organic layer CF continuously or discontinuously. A degree of carbonization of the organic layer CF may vary depending on quantity, repetition rate, wave length, or pulse width of a laser. The light-blocking portion BP may have a black color, and thus may block light. The light-blocking portion BP is disposed on the same layer as the organic layer CF.

When the organic layer CF is selectively removed, the repair hole RH may be formed, which may cause light leakage through the selectively removed portion. However, a method of repairing a display substrate according to an exemplary embodiment includes forming the light-blocking portion BP. Thus, light leaked through the repair hole RH may be blocked. Forming the light-blocking portion BP may be omitted, when light leaked through the repair hole RH may be insignificant.

Figure 37:
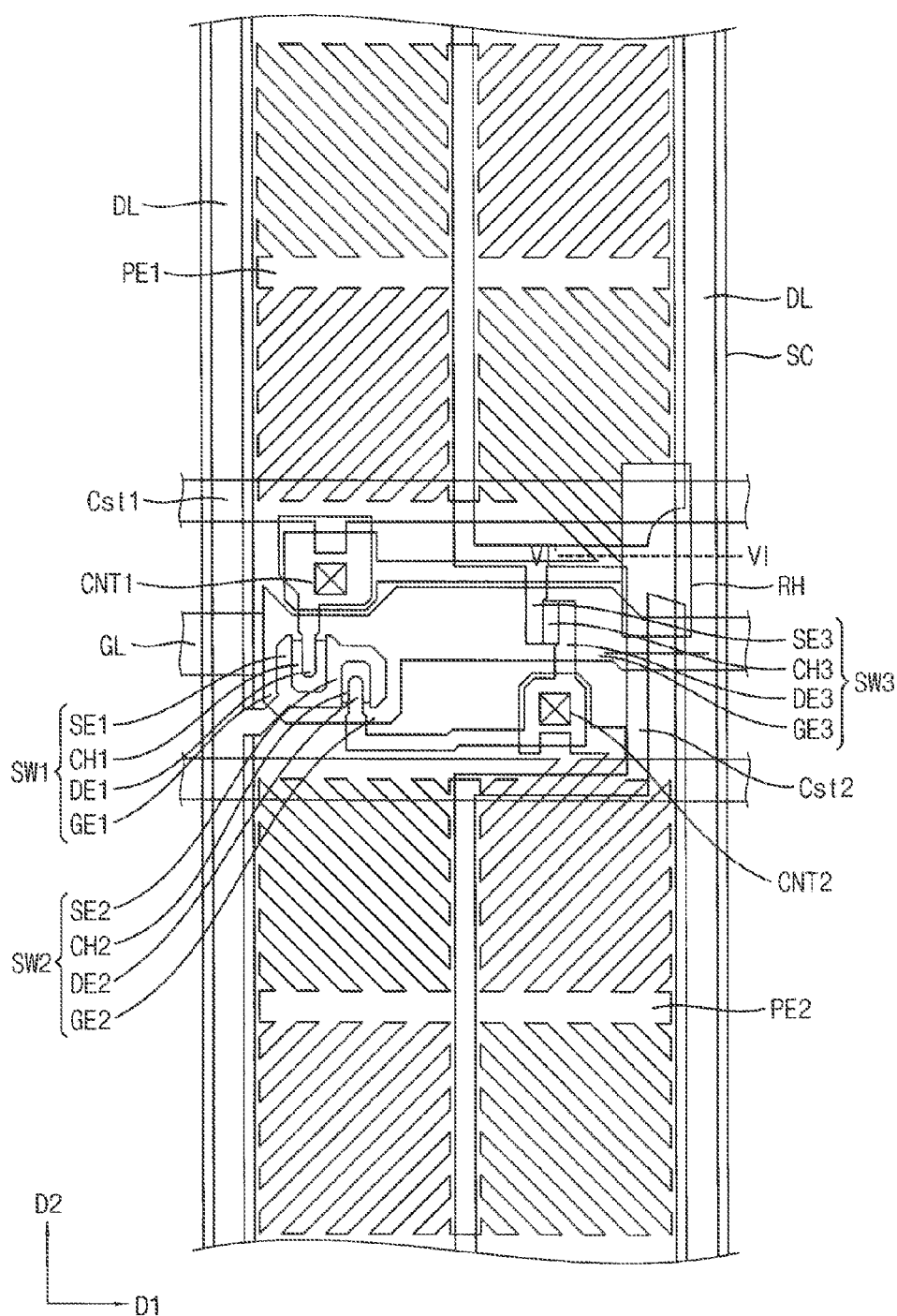
FIG. 37 is a plan view illustrating a display substrate repaired by a method of repairing a display substrate of FIG. 35.
Figure 38:
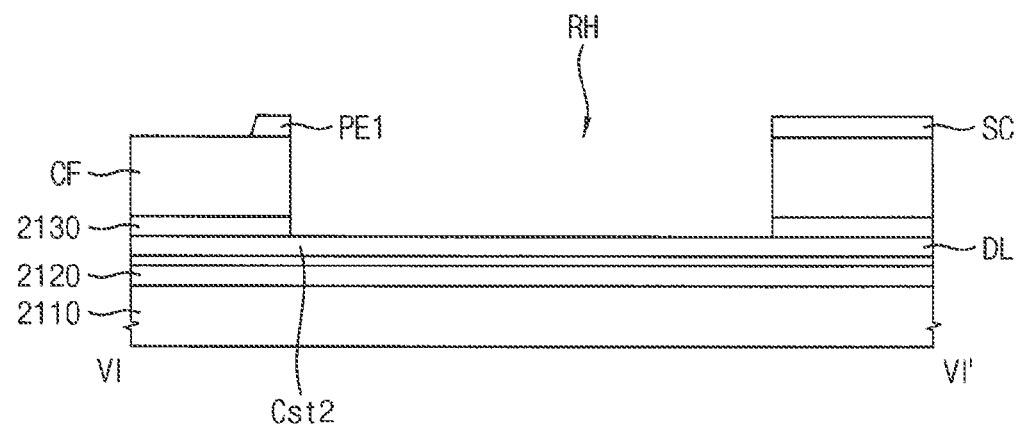
FIG. 38 is a cross-sectional view taken along line VI-VI' of FIG. 37.

FIG. 37 is a plan view illustrating a display substrate repaired by a method of repairing a display substrate of FIG. 35. FIG. 38 is a cross-sectional view taken along line VI-VI' of FIG. 37.

Referring to FIGS. 37 and 38, a portion of the organic layer CF is removed to form a repair hole RH exposing the data line DL and the second storage line Cst2 having a defect.

A portion of the organic layer CF is removed to form a repair hole RH exposing the data line DL and the second storage line Cst2 having a defect. The process of forming a repair hole RH may be performed by using an ultra-fast laser. For example, the ultra-fast laser may be a pico-second laser, a femto-second laser, or an atto-second laser.

The repair hole RH may expose the gate metal pattern or the data metal pattern having defects. In the present exemplary embodiment, exposing the data line DL and the second storage line Cst2 having defects caused by shorting may be partially exposed. A process of forming the repair hole RH may include irradiating an ultra-fast laser to the organic layer CF to remove a portion of the organic layer CF disposed on the data line DL and the second storage line Cst2, and to expose the data line DL and the second storage line Cst2 having defects.

Figure 39:
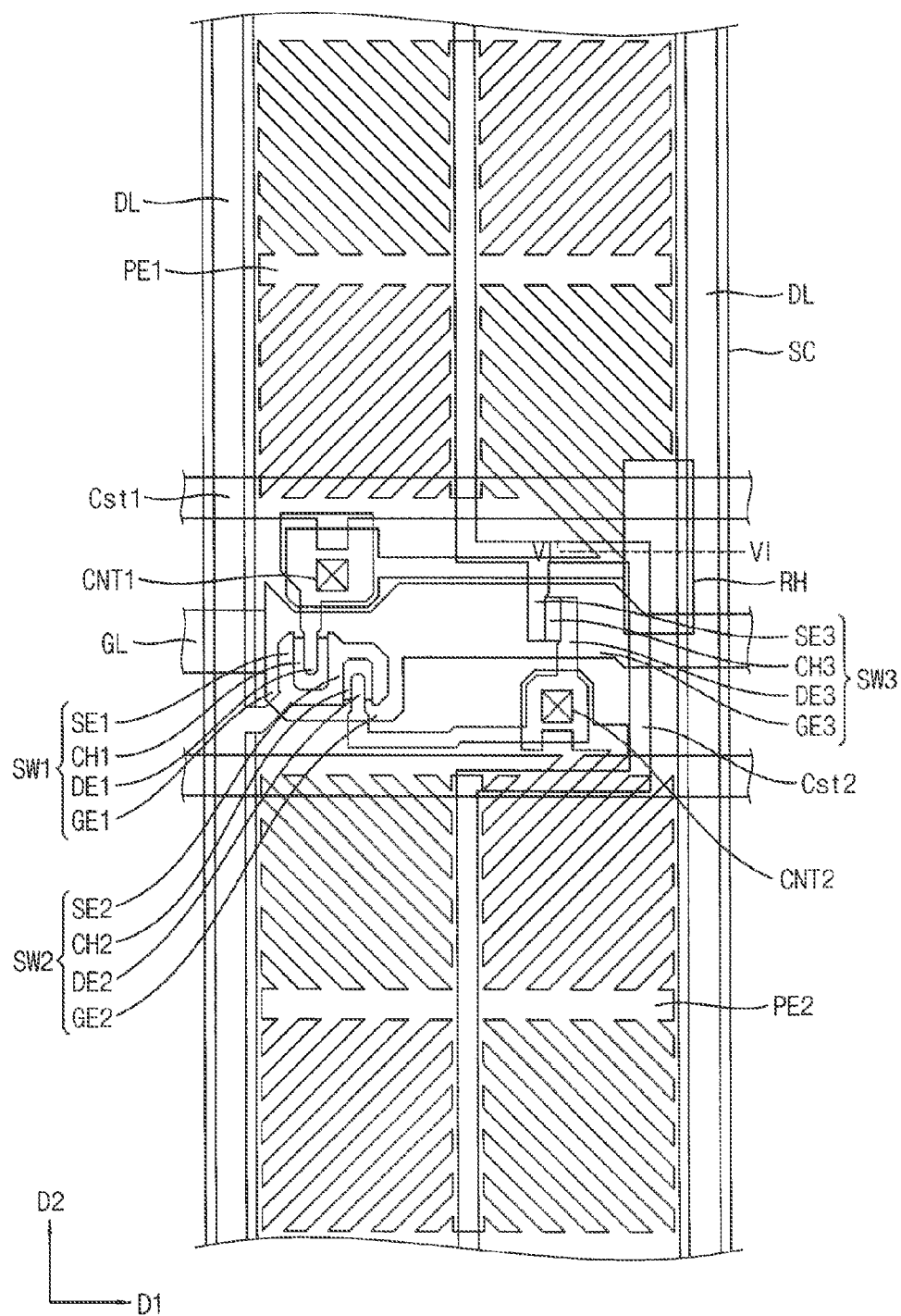
FIG. 39 is a plan view illustrating a display substrate repaired by a method of repairing a display substrate of FIG. 35.
Figure 40:
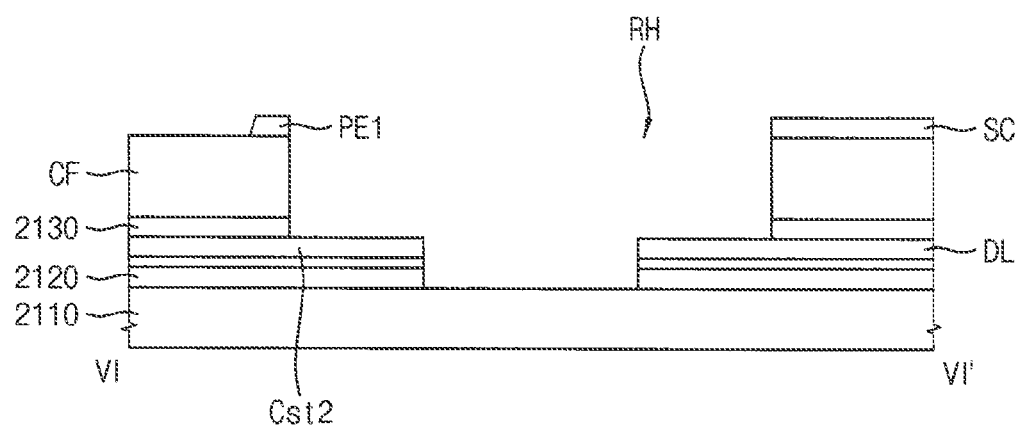
FIG. 40 is a cross-sectional view taken along line VI-VI' of FIG. 39.

FIG. 39 is a plan view illustrating a display substrate repaired by a method of repairing a display substrate of FIG. 35. FIG. 40 is a cross-sectional view taken along line VI-VI' of FIG. 39.

Referring to FIGS. 39 and 40, after the data line DL and the second storage line Cst2 having defects are exposed, a shorting point between the data line DL and the second storage line Cst2 may be cut.

After the data line DL and the second storage line Cst2 having defects are exposed, a shorting point between the data line DL and the second storage line Cst2 may be cut. The process of cutting the shorting point is performed by using an ultra-fast laser. For example, the ultra-fast laser may be a pico-second laser, a femto-second laser, or an atto-second laser.

The data metal pattern formed between the data line DL and the second storage line Cst2 are removed to repair the defects between the data line DL and the second storage line Cst2.

Referring back to FIGS. 35 and 36, a light-blocking portion BP is formed in a peripheral area of the repair hole RH.

After the data metal pattern formed between the data line DL and the second storage line Cst2 are removed, the light-blocking portion BP is formed in a peripheral area of the repair hole RH. A laser is irradiated onto the organic layer CF adjacent to the repair hole RH to form the light-blocking portion BP. The light-blocking portion BP is formed by using an ultra-fast laser. For example, the ultra-fast laser may be a pico-second laser, a femto-second laser, or an atto-second laser.

When the organic layer CF is carbonized by a laser, the light-blocking portion BP may be formed. The laser may be irradiated onto the organic layer CF continuously or discontinuously. A degree of carbonization of the organic layer CF may vary depending on quantity, repetition rate, wave length, or pulse width of a laser. The light-blocking portion BP may have a black color, and thus may block light. The light-blocking portion BP is disposed on the same layer as the organic layer CF.

When the organic layer CF is selectively removed, the repair hole RH may be formed, which may cause light leakage through the selectively removed portion. However, a method of repairing a display substrate according to an exemplary embodiment includes forming the light-blocking portion BP. Thus, light leaked through the repair hole RH may be blocked. Forming the light-blocking portion BP may be omitted, when light leaked through the repair hold RH may be insignificant.

According to an exemplary embodiment, a method of repairing a display substrate uses an ultra-fast laser to selectively remove the organic layer overlapping the gate metal pattern or the data metal pattern having defects, such that defects of display substrate may be repaired exquisitely. In addition, a method of repairing a display substrate according to an exemplary embodiment includes forming the light-blocking portion in a peripheral area of the repair hole, which may block light leakage through the repair hole.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A method of repairing a display substrate comprising defects from disconnection of a data line therein, the method comprising:
   irradiating an ultra-fast laser to an organic layer disposed on the data line;
   removing portions of the organic layer disposed over first and second areas of the data line, the first and second areas of the data line each being spaced apart from a disconnection point of the data line, to expose the data line in the first and second areas such that repair holes spatially connecting the first and second areas are formed;
   ablating side portions of the exposed data line in the first and second areas;
   forming a repair line in the repair holes,
   wherein the display substrate comprises:
      a gate metal pattern comprising:
         a gate line extending in a first direction; and
         a gate electrode electrically connected to the gate line and a storage line;
      a data metal pattern comprising:
         the data line extending in a second direction crossing the first direction;
         a source electrode electrically connected to the data line; and
         a drain electrode spaced apart from the source electrode; and
      the organic layer disposed on the data metal pattern.

2. The method of claim 1, wherein ablating the side portions of the exposed first and second areas of the data line is performed by an ultra-fast laser.

3. The method of claim 1, wherein removing the portions of the organic layer is performed by an ultra-fast laser.

4. The method of claim 1, wherein forming the repair line is performed by a laser chemical vapor deposition (CVD) method or an inkjet method.

5. The method of claim 1, further comprising forming a light-blocking portion in a peripheral area of the repair holes,
   wherein forming the light-blocking portion is performed by an ultra-fast laser.

6. The method of claim 5, wherein the light-blocking portion is disposed on a same layer as the organic layer.

7. The method of claim 6, wherein:
   the repair line is disposed on a same layer as the data line; and the repair line electrically connects the exposed first and second areas of the data line.

8. The method of claim 1, wherein the display substrate further comprises a pixel electrode disposed on the organic layer and electrically connected to the drain electrode.

9. The method of claim 8, wherein the display substrate further comprises a floating electrode disposed on a same layer as the pixel electrode and insulated from the pixel electrode.

\* \* \* \* \*